(12) United States Patent
Park et al.

(10) Patent No.: US 11,087,692 B2
(45) Date of Patent: Aug. 10, 2021

(54) METHOD OF DRIVING A DISPLAY PANEL AND ORGANIC LIGHT EMITTING DISPLAY DEVICE EMPLOYING THE SAME

(71) Applicant: Samsung Display Co., Ltd., Yongin-si (KR)

(72) Inventors: Seungho Park, Suwon-si (KR); Miyoung Joo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 27 days.

(21) Appl. No.: 16/237,814

(22) Filed: Jan. 2, 2019

(65) Prior Publication Data

US 2019/0213956 A1     Jul. 11, 2019

(30) Foreign Application Priority Data

Jan. 11, 2018    (KR) .................. 10-2018-0003919

(51) Int. Cl.
    *G09G 3/3283*     (2016.01)
    *H01L 27/32*     (2006.01)
    (Continued)

(52) U.S. Cl.
    CPC ......... *G09G 3/3283* (2013.01); *G09G 3/3225* (2013.01); *H01L 27/3213* (2013.01);
    (Continued)

(58) Field of Classification Search
    CPC .. G09G 3/3283; G09G 3/3225; G09G 3/2074; G09G 2300/0452;
    (Continued)

(56) References Cited

U.S. PATENT DOCUMENTS 6,466,186 B1 * 10/2002 Shimizu ............... G09G 3/2942
                                                               345/60
7,742,066 B2     6/2010   Choi
                   (Continued)

FOREIGN PATENT DOCUMENTS

KR    10-2006-0073681     6/2006
KR        10-0600867     7/2006
KR    10-2014-0038146     3/2014

*Primary Examiner* — Sejoon Ahn
(74) *Attorney, Agent, or Firm* — H.C. Park & Associates, PLC

(57) ABSTRACT

A method of driving a display panel includes: grouping m adjacent pixels, which output same color light, into one pixel-group in the display panel, where m is an integer greater than or equal to two; determining whether a unit grayscale (UG) to be implemented by the pixel-group is greater than or equal to a determined reference grayscale (REFG) by analyzing respective data signals applied to the pixel-group; performing, in response to the UG being greater than or equal to the REFG, a normal driving that implements the UG by controlling all of the m adjacent pixels to emit light with first luminance corresponding to the respective data signals; and performing, in response to the UG being less than the REFG, a combination driving that implements the UG by controlling only a portion of the m adjacent pixels to emit light with second luminance that is greater than the first luminance.

19 Claims, 14 Drawing Sheets

(51) Int. Cl.
　　　*G09G 3/3225*　　(2016.01)
　　　*G09G 3/20*　　(2006.01)
(52) U.S. Cl.
　　　CPC ... *G09G 3/2074* (2013.01); *G09G 2300/0452* (2013.01); *G09G 2310/027* (2013.01); *G09G 2310/0272* (2013.01); *G09G 2320/0233* (2013.01); *G09G 2320/0626* (2013.01); *G09G 2320/0633* (2013.01); *G09G 2340/0435* (2013.01); *G09G 2360/16* (2013.01)
(58) Field of Classification Search
　　　CPC ..... G09G 2310/027; G09G 2310/0272; G09G 2320/0233; G09G 2320/0626; G09G 2320/0633; G09G 2340/0435; G09G 2360/16; H01L 27/3213
　　　See application file for complete search history.

(56) References Cited

U.S. PATENT DOCUMENTS

| | | | |
|---|---|---|---|
| 8,749,665 B2* | 6/2014 | Wang | H04N 5/378 348/229.1 |
| 2008/0063240 A1* | 3/2008 | Keng | G06K 9/036 382/112 |
| 2008/0316333 A1* | 12/2008 | Furuya | H04N 5/35554 348/229.1 |
| 2009/0153591 A1* | 6/2009 | Shin | G09G 5/10 345/690 |
| 2012/0007899 A1* | 1/2012 | Kuijpers | G09G 3/3607 345/690 |
| 2013/0201223 A1 | 8/2013 | Li et al. | |
| 2013/0241900 A1* | 9/2013 | Ge | G09G 3/006 345/204 |
| 2013/0241959 A1* | 9/2013 | Ge | G09G 3/3648 345/690 |
| 2014/0078031 A1 | 3/2014 | Jang et al. | |
| 2015/0235616 A1* | 8/2015 | Wu | G09G 5/02 345/694 |
| 2015/0279911 A1* | 10/2015 | Park | H01L 51/56 257/89 |
| 2015/0379909 A1* | 12/2015 | Yu | G09G 3/3258 345/690 |
| 2016/0171921 A1 | 6/2016 | Park et al. | |
| 2016/0217753 A1* | 7/2016 | Cao | G09G 3/2007 |
| 2016/0267856 A1* | 9/2016 | Chen | G09G 5/026 |
| 2019/0114993 A1* | 4/2019 | Yang | G09G 3/3607 |

\* cited by examiner

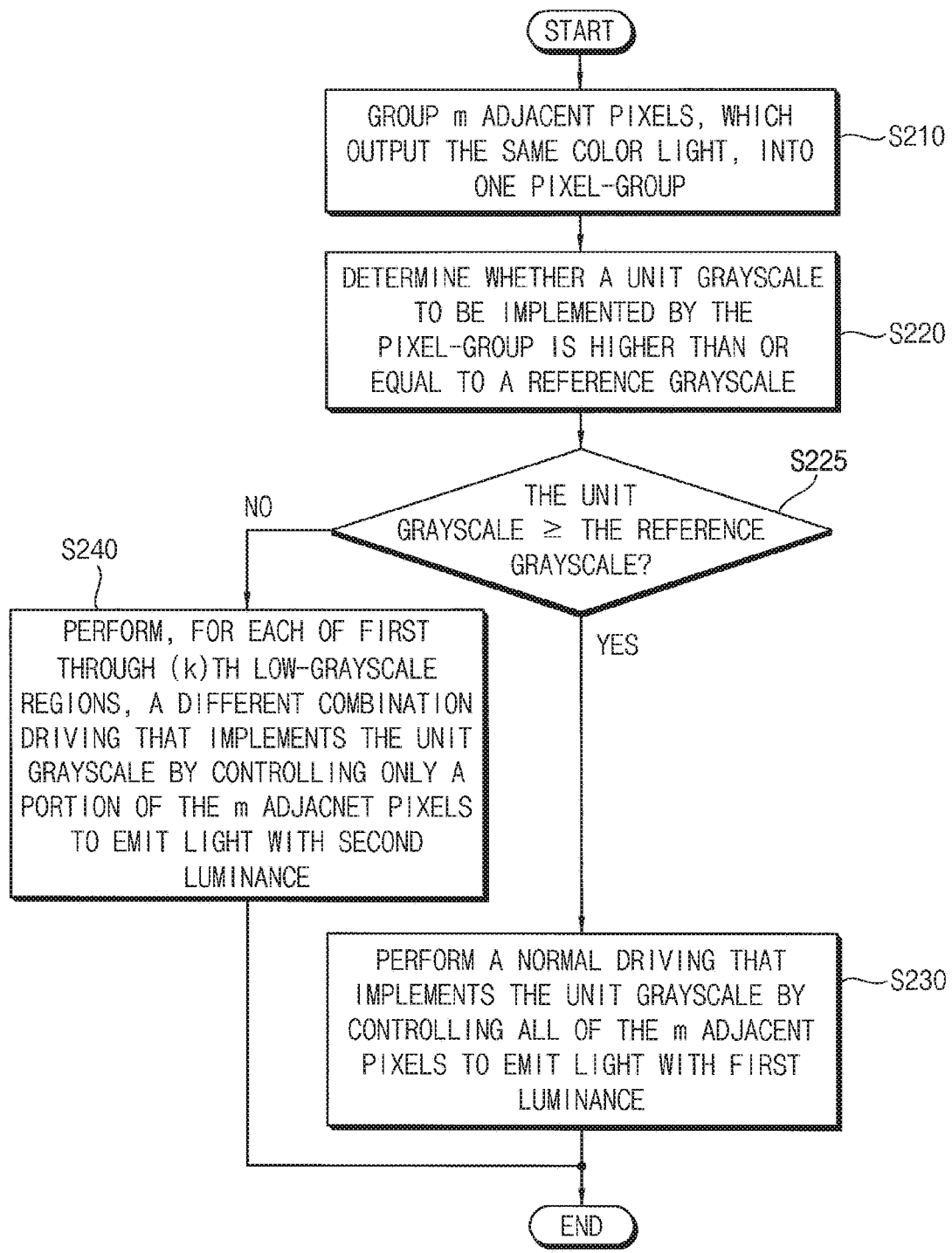

METHOD OF DRIVING A DISPLAY PANEL AND ORGANIC LIGHT EMITTING DISPLAY DEVICE EMPLOYING THE SAME

CROSS-REFERENCE TO RELATED APPLICATION

This application claims priority from and the benefit of Korean Patent Application No. 10-2018-0003919, filed Jan. 11, 2018, which is hereby incorporated by reference for all purposes as if fully set forth herein.

BACKGROUND

Field

Exemplary embodiments generally relate to display devices, and, more particularly, to a method of driving a display panel that includes a plurality of pixels each having an organic light emitting element and an organic light emitting display device that employs the method of driving the display panel.

Discussion

An organic light emitting display device has been spotlighted as a display device included in an electronic device. In the organic light emitting display device, each pixel may implement (or represent) a grayscale by controlling a current flowing through an organic light emitting element based on a data signal. It may be desired for different pixels to emit the same luminance in response to the same data signal. Because deviation of characteristics of elements (e.g., a transistor, an organic light emitting diode, etc.) between the pixels, deviation of luminance due to the deviation of the characteristics of the elements may be caused even when the same data signal is applied to the pixels. A conventional non-uniform luminance compensation technique may remove luminance stains by performing data compensation on the organic light emitting display device using an optical imaging technique (e.g., by displaying a for-compensation image on a display panel, by capturing (e.g., photographing, etc.) the for-compensation image using a camera device, by analyzing the captured image to determine compensation values, and by reflecting the compensation values on image data). However, a current flowing through each pixel is relatively small in case of a low-grayscale stain. In addition, there is a limit to performance of a camera device to capture low-grayscale stains. As a result, accuracy of the data compensation for low-grayscale stains is relatively low as compared to that for a high-grayscale stain.

The above information disclosed in this section is only for understanding the background of the inventive concepts, and, therefore, may contain information that does not form prior art.

SUMMARY

Some exemplary embodiments are capable of providing a method of driving a display panel that can effectively remove a low-grayscale stain without data compensation that uses an optical imaging technique.

Some exemplary embodiments are capable of providing an organic light emitting display device employing the method of driving the display panel.

Additional aspects will be set forth in the detailed description which follows, and, in part, will be apparent from the disclosure, or may be learned by practice of the inventive concepts.

According to some exemplary embodiments, a method of driving a display panel includes: grouping m adjacent pixels, which output a same color light, into one pixel-group in the display panel, where m is an integer greater than or equal to two; determining whether a unit grayscale to be implemented by the pixel-group is greater than or equal to a determined reference grayscale by analyzing respective data signals applied to the pixel-group; performing, in response to the unit grayscale being greater than or equal to the reference grayscale, a normal driving that implements the unit grayscale by controlling all of the m adjacent pixels to emit light with first luminance corresponding to the respective data signals; and performing, in response to the unit grayscale being less than the reference grayscale, a combination driving that implements the unit grayscale by controlling only a portion of the m adjacent pixels to emit light with second luminance that is greater than the first luminance.

In some exemplary embodiments, the combination driving may be performed such that n adjacent pixels, where n is an integer greater than or equal to 1 and smaller than m, are selected among the m adjacent pixels, and the second luminance is m/n times the first luminance.

In some exemplary embodiments, the combination driving may be performed such that the n adjacent pixels are differently and alternately selected among the m adjacent pixels for respective frames.

In some exemplary embodiments, the combination driving may be separately performed on blue color pixels, red color pixels, and green color pixels.

In some exemplary embodiments, the combination driving may be separately performed on blue color pixels, red color pixels, green color pixels, and white color pixels.

In some exemplary embodiments, a driving frequency of the display panel may be less than a determined reference frequency such that the normal driving may be performed on all pixel-groups of the display panel.

In some exemplary embodiments, a number of low-grayscale pixel-groups of which the unit grayscale is less than the reference grayscale may be greater than or equal to a determined reference number in the display panel such that the combination driving may be performed on all pixel-groups of the display panel.

In some exemplary embodiments, a number of high-grayscale pixel-groups of which the unit grayscale is greater than or equal to the reference grayscale may be greater than or equal to a determined reference number in the display panel such that the normal driving may be performed on all pixel-groups of the display panel.

According to some exemplary embodiments, a method of driving a display panel includes: grouping m adjacent pixels, which output a same color light, into one pixel-group in the display panel, where m is an integer greater than or equal to two; determining whether a unit grayscale to be implemented by the pixel-group is greater than or equal to a determined reference grayscale by analyzing respective data signals applied to the pixel-group; performing, in response to the unit grayscale belonging to a high-grayscale region that is greater than or equal to the reference grayscale, a normal driving that implements the unit grayscale by controlling all of the m adjacent pixels to emit light with first luminance corresponding to the respective data signals; and performing, in response to the unit grayscale belonging to first through (k)-th low-grayscale regions that are less than the reference grayscale, where k is an integer greater than or equal to two, a combination driving that implements the unit grayscale by controlling n adjacent pixels of the m adjacent pixels, where n is an integer greater than or equal to 1 and less than m, to emit light with second luminance that is m/n times the first luminance. The variables n and m are differently determined for the first through (k)-th low-grayscale regions.

In some exemplary embodiments, the combination driving may be performed such that the n adjacent pixels are differently and alternately selected among the m adjacent pixels for respective frames.

In some exemplary embodiments, the combination driving may be separately performed on blue color pixels, red color pixels, and green color pixels.

In some exemplary embodiments, the combination driving may be separately performed on blue color pixels, red color pixels, green color pixels, and white color pixels.

In some exemplary embodiments, a driving frequency of the display panel may be less than a determined reference frequency such that the normal driving may be performed on all pixel-groups of the display panel.

In some exemplary embodiments, a number of low-grayscale pixel-groups of which the unit grayscale is less than the reference grayscale may be greater than or equal to a determined reference number in the display panel such that the combination driving may be performed on all pixel-groups of the display panel.

In some exemplary embodiments, a number of high-grayscale pixel-groups of which the unit grayscale is greater than or equal to the reference grayscale may be greater than or equal to a determined reference number in the display panel such that the normal driving may be performed on all pixel-groups of the display panel.

According to some exemplary embodiments, an organic light emitting display device may include a display panel, a display panel driving circuit, and a driving control circuit. The display panel includes pixels, each pixel including an organic light emitting element. The display panel driving circuit is configured to drive the display panel. The driving control circuit is configured to: group m adjacent pixels, which output a same color light, into one pixel-group in the display panel, where m is an integer greater than or equal to two; and selectively perform, based on whether a unit grayscale to be implemented by the pixel-group is greater than or equal to a determined reference grayscale, a normal driving configured to operate all of the m adjacent pixels or a combination driving configured to operate only a portion of the m adjacent pixels.

In some exemplary embodiments, the driving control circuit may be part of the display panel driving circuit.

In some exemplary embodiments, the combination driving may be performed, and the driving control circuit may be configured to differently and alternately select the portion of the m adjacent pixels for respective frames to alternate a light emitting pattern of the pixel-group for the frames.

In some exemplary embodiments, the driving control circuit may be configured to: perform, in response to the unit grayscale being greater than or equal to the reference grayscale, the normal driving that implements the unit grayscale by controlling all of the m adjacent pixels to emit light with first luminance corresponding to respective data signals; and perform, in response to the unit grayscale being less than the reference grayscale, the combination driving that implements the unit grayscale by controlling n adjacent pixels of the m adjacent pixels, where n is an integer greater than or equal to one and less than m, to emit light with second luminance that is m/n times the first luminance.

In some exemplary embodiments, the driving control circuit may be configured to: perform, in response to the unit grayscale belonging to a high-grayscale region that is greater than or equal to the reference grayscale, the normal driving that implements the unit grayscale by controlling all of the m adjacent pixels to emit light with first luminance corresponding to respective data signals; and perform, in response to the unit grayscale belonging to first through (k)-th low-grayscale regions that are less than the reference grayscale, where k is an integer greater than or equal to two, the combination driving that implements the unit grayscale by controlling n adjacent pixels of the m adjacent pixels, where n is an integer greater than or equal to one and less than m, to emit light with second luminance that is m/n times the first luminance. The variables n and m may be differently determined for the first through (k)-th low-grayscale regions.

According to various exemplary embodiments, a method of driving a display panel may drive the display panel by grouping m adjacent pixels, which output a same color light, into one pixel-group in the display panel, by implementing a unit grayscale of the pixel-group by controlling all of the m adjacent pixels to emit light with first luminance corresponding to respective data signals in response to the unit grayscale to be implemented by the pixel-group being higher than or equal to a reference grayscale, and by implementing the unit grayscale of the pixel-group by controlling only a portion of the m adjacent pixels to emit light with second luminance that is greater than the first luminance corresponding to respective data signals in response to the unit grayscale to be implemented by the pixel-group being less than the reference grayscale. In this manner, the method of driving the display panel may effectively remove a low-grayscale stain without data compensation that uses an optical imaging technique. In addition, an organic light emitting display device employing the method of driving the display panel may provide a high-quality image to a viewer (or user).

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 5 is a flowchart illustrating a method of driving a display panel according to some exemplary embodiments.

DETAILED DESCRIPTION OF THE ILLUSTRATED EMBODIMENTS

Figure 1:
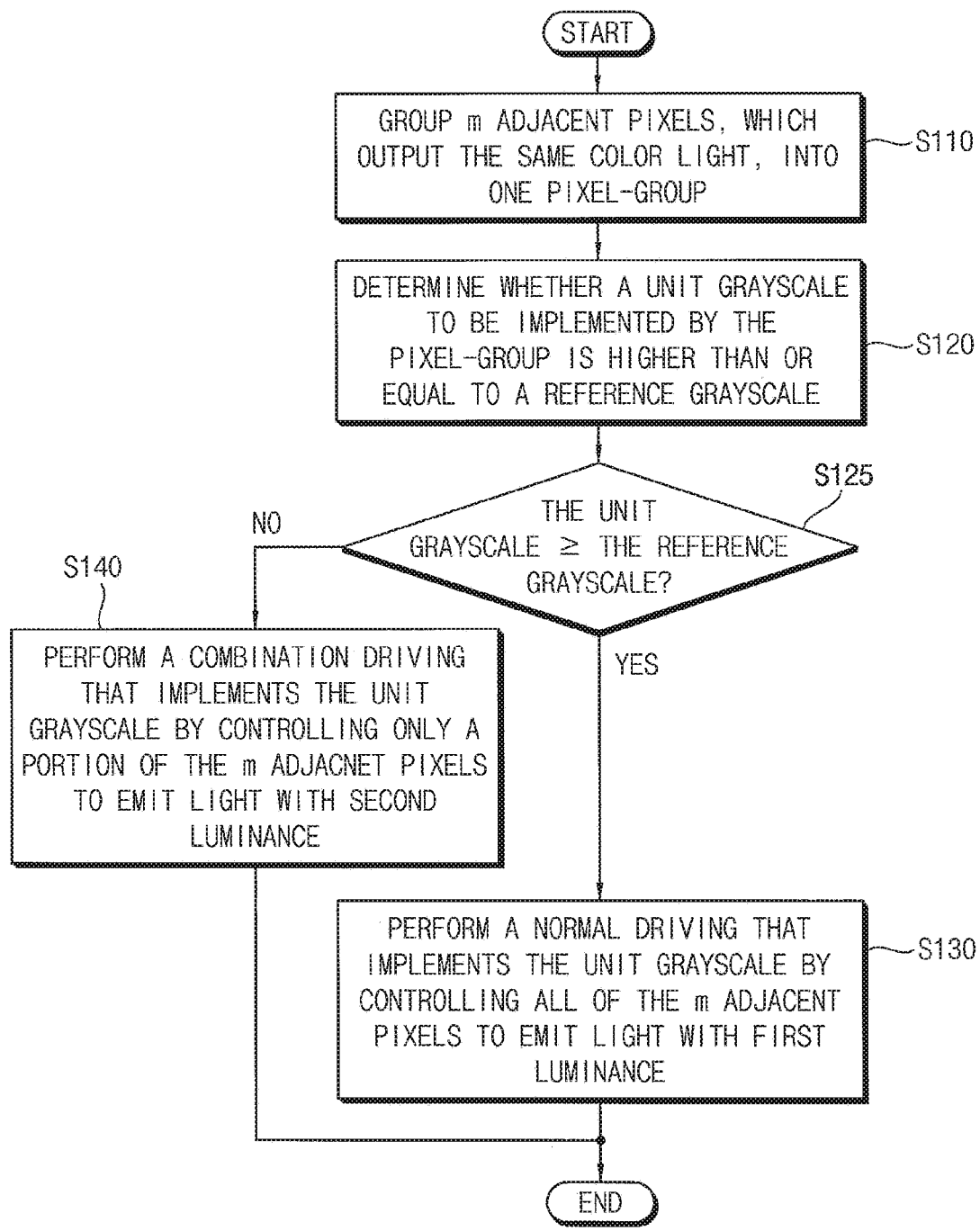
FIG. 1 is a flowchart illustrating a method of driving a display panel according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, exemplary embodiments of the inventive concepts will be explained in detail with reference to the accompanying drawings.

Figure 2A:
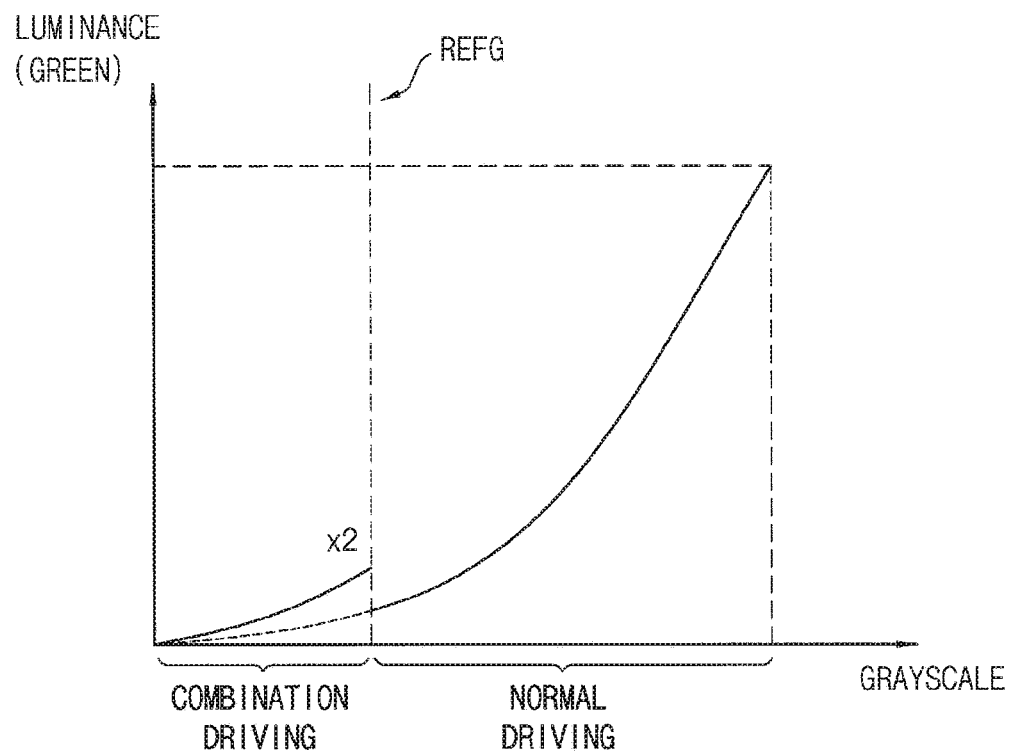
FIG. 2A is a graph illustrating an example of a combination driving that is performed by the method of FIG. 1 according to some exemplary embodiments.
Figure 2B:
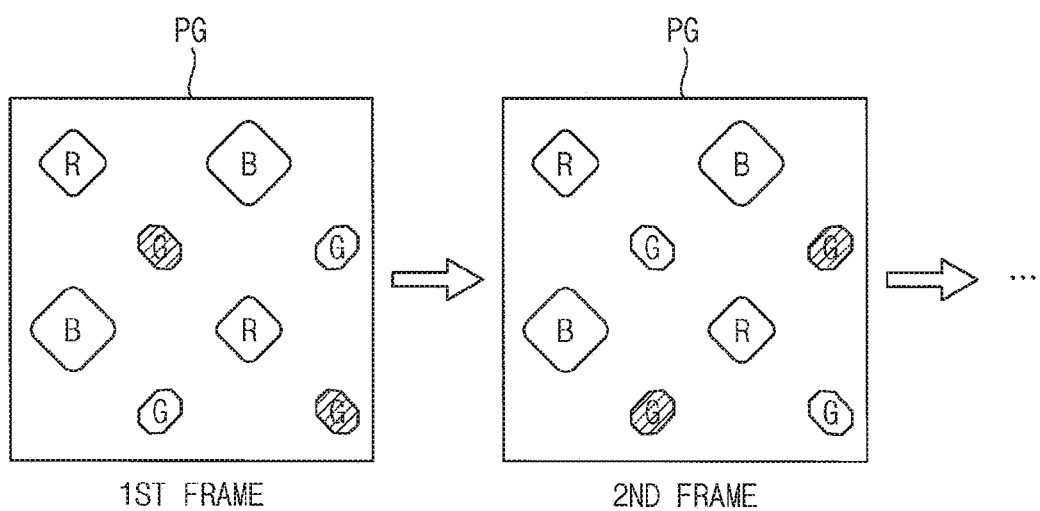
FIG. 2B is a diagram illustrating an example of a combination driving that is performed by the method of FIG. 1 according to some exemplary embodiments.
Figure 3A:
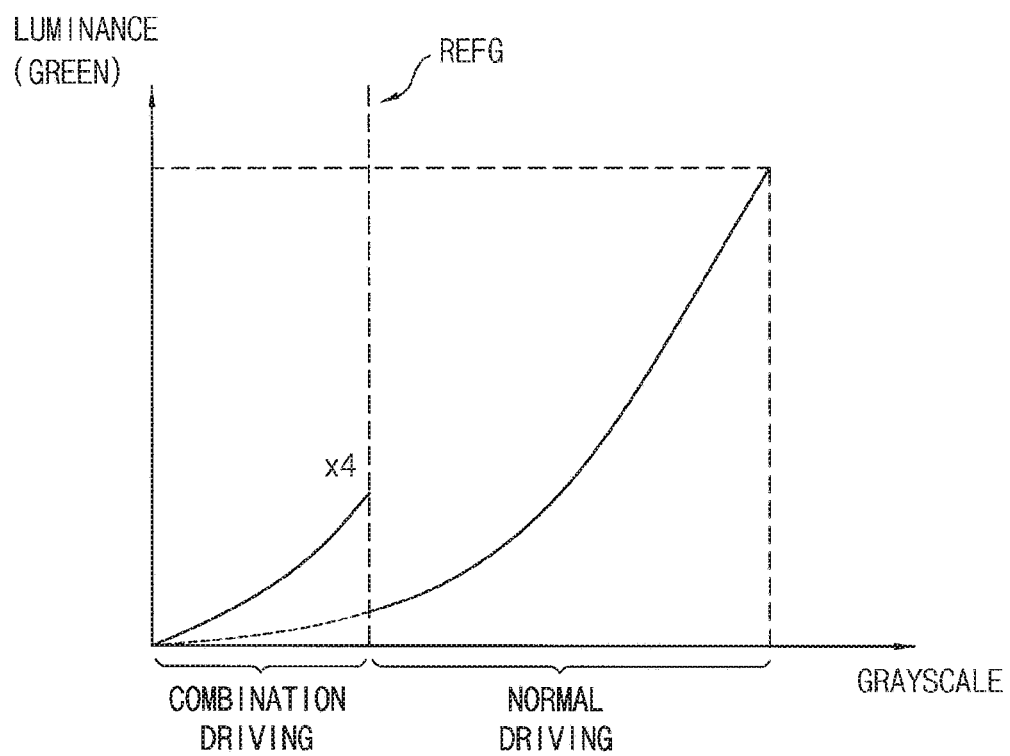
FIG. 3A is a graph illustrating another example of a combination driving that is performed by the method of FIG. 1 according to some exemplary embodiments.
Figure 3B:
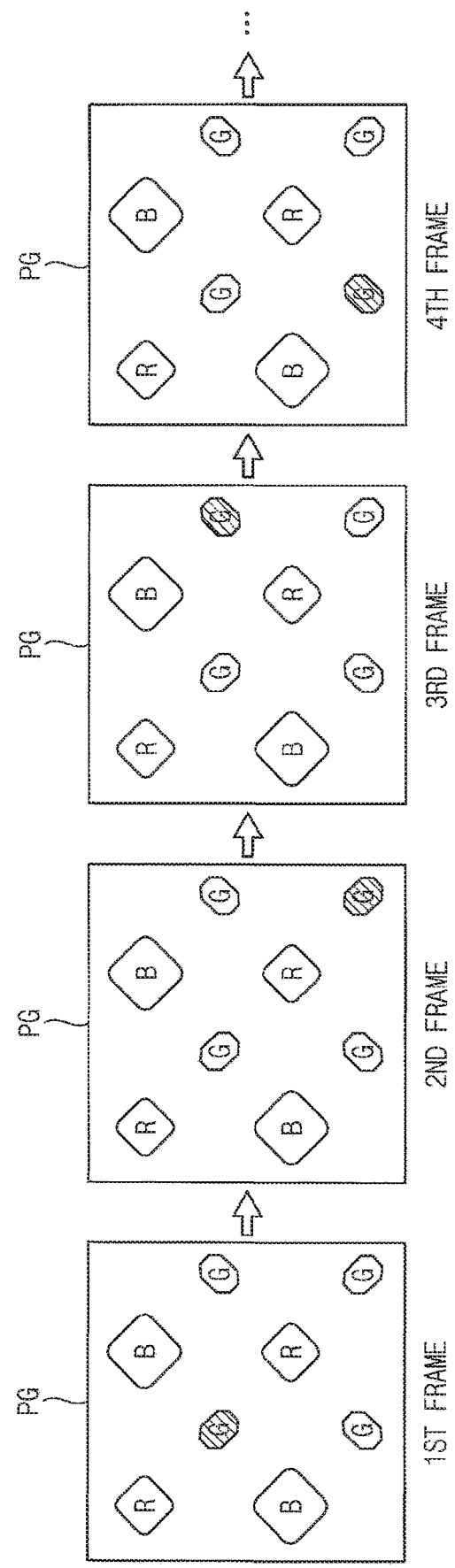
FIG. 3B is a diagram illustrating another example of a combination driving that is performed by the method of FIG. 1 according to some exemplary embodiments.
Figure 4A:
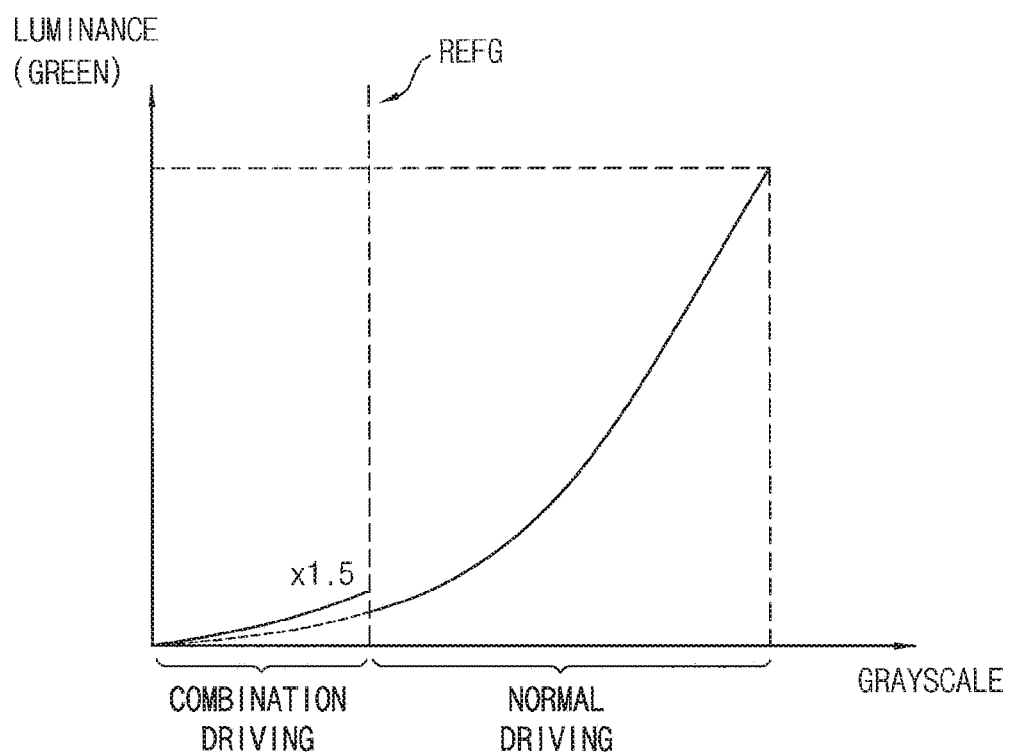
FIG. 4A is a graph illustrating still another example of a combination driving that is performed by the method of FIG. 1 according to some exemplary embodiments.
Figure 4B:
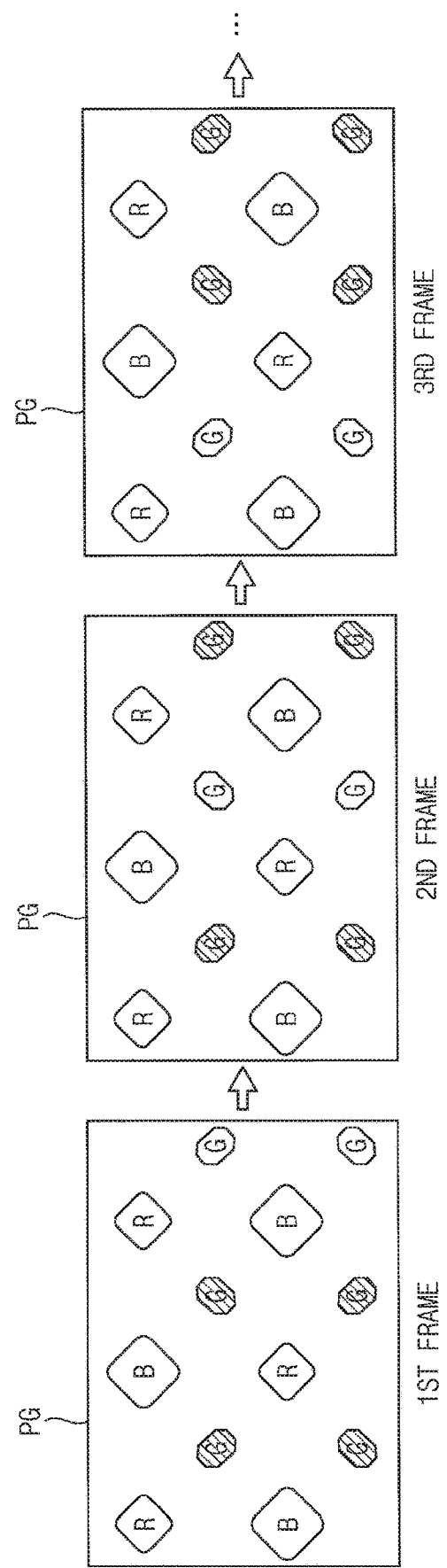
FIG. 4B is a diagram illustrating still another example of a combination driving that is performed by the method of FIG. 1 according to some exemplary embodiments.

FIG. 1 is a flowchart illustrating a method of driving a display panel according to some exemplary embodiments. FIG. 2A is a graph illustrating an example of a combination driving that is performed by the method of FIG. 1 according to some exemplary embodiments. FIG. 2B is a diagram illustrating an example of a combination driving that is performed by the method of FIG. 1 according to some exemplary embodiments. FIG. 3A is a graph illustrating another example of a combination driving that is performed by the method of FIG. 1 according to some exemplary embodiments. FIG. 3B is a diagram illustrating another example of a combination driving that is performed by the method of FIG. 1 according to some exemplary embodiments. FIG. 4A is a graph illustrating still another example of a combination driving that is performed by the method of FIG. 1 according to some exemplary embodiments. FIG. 4B is a diagram illustrating still another example of a combination driving that is performed by the method of FIG. 1 according to some exemplary embodiments.

Referring to FIGS. 1 to 4B, the method of FIG. 1 may group m adjacent pixels, which output the same color light, into one pixel-group PG in the display panel, where "m" is an integer greater than or equal to two (2) (S110), may determine whether a unit grayscale to be implemented by the pixel-group PG is greater than or equal to a reference grayscale REFG (S125) by analyzing respective data signals applied to the pixel-group PG (S120), may perform a normal driving that implements the unit grayscale by controlling (or operating) all of the m adjacent pixels to emit light with first luminance corresponding to the respective data signals (S130) when the unit grayscale to be implemented by the pixel-group PG is greater than or equal to the reference grayscale REFG, and may perform a combination driving that implements the unit grayscale by controlling (or operating) only a portion of the m adjacent pixels to emit light with second luminance that is greater than the first luminance (S140) when the unit grayscale to be implemented by the pixel-group PG is not greater than or equal to the reference grayscale REFG (e.g., when the unit grayscale to be implemented by the pixel-group PG is less than the reference grayscale REFG).

In some exemplary embodiments, when the display panel includes blue color pixels B that emit blue color light, red color pixels R that emit red color light, and green color pixels G that emit green color light, the method of FIG. 1 may separately (or independently) perform the steps S110, S120, S125, S130, and S140 for the blue color pixels B, the red color pixels R, and the green color pixels G. In other words, the method of FIG. 1 may perform the steps S110, S120, S125, S130, and S140 for the blue color pixels B, may perform the steps S110, S120, S125, S130, and S140 for the red color pixels R, and may perform the steps S110, S120, S125, S130, and S140 for the green color pixels G.

In some exemplary embodiments, when the display panel includes blue color pixels B that emit blue color light, red color pixels R that emit red color light, green color pixels G that emit green color light, and white color pixels W that emit white color light, the method of FIG. 1 may separately perform the steps S110, S120, S125, S130, and S140 for the blue color pixels B, the red color pixels R, the green color pixels G, and the white color pixels W. In other words, the method of FIG. 1 may perform the steps S110, S120, S125, S130, and S140 for the blue color pixels B, may perform the steps S110, S120, S125, S130, and S140 for the red color pixels R, may perform the steps S110, S120, S125, S130, and S140 for the green color pixels G, and may perform the steps S110, S120, S125, S130, and S140 for the white color pixels W. For convenience of description, in FIGS. 1 to 4B, the method of FIG. 1 will be described focusing on the green color pixels G that emit the green color light.

Specifically, the method of FIG. 1 may group the m adjacent pixels, which output the same color light, into one pixel-group PG in the display panel. In case of the green color pixels G, m adjacent green color pixels G that emit the green color light may be grouped into one pixel-group PG in the display panel. For example, as illustrated in FIGS. 2B and 3B, four adjacent green color pixels G may be grouped into one pixel-group PG. For example, as illustrated in FIG. 4B, six adjacent green color pixels G may be grouped into one pixel-group PG. In some exemplary embodiments, when an image is displayed on the display panel, the range, location, member, etc., of the pixel-group PG may not be fixed. That is, the range, location, member, etc., of the pixel-group PG may be varied according to the combination driving to be performed. For example, four adjacent green color pixels G may operate (or act) as one pixel-group PG (e.g., illustrated in FIGS. 2B and 3B), and then six adjacent green color pixels G may operate as one pixel-group PG (e.g., illustrated in FIG. 4B) according to requirements for displaying the image (e.g., when changing the combination driving to be performed is performed).

Subsequently, the method of FIG. 1 may determine whether the unit grayscale to be implemented by the pixel-group PG is greater than or equal to the reference grayscale REFG (S125) by analyzing the respective data signals applied to the pixel-group PG (S120). Generally, a low-grayscale stain may be caused at least because a current flowing through an organic light emitting element included in each pixel that implements a low-grayscale is relatively small. In other words, it is difficult to accurately control the current flowing through the organic light emitting element included in each pixel that implements the low-grayscale. Thus, the reference grayscale REFG may be determined as a given grayscale at which it is determined that accurately controlling the current flowing through the organic light emitting element included in each pixel is possible. In addition, the unit grayscale to be implemented by the pixel-group PG may be determined based on grayscales to be implemented by the m adjacent pixels composing the pixel-group PG. In some exemplary embodiments, the unit grayscale to be implemented by the pixel-group PG may be determined as a grayscale of a pixel that implements the highest grayscale among the m adjacent pixels composing the pixel-group PG. In some exemplary embodiments, the unit grayscale to be implemented by the pixel-group PG may be determined as a grayscale of a pixel that implements the lowest grayscale among the m adjacent pixels composing the pixel-group PG. In some exemplary embodiments, the unit grayscale to be implemented by the pixel-group PG may be determined as an average of the grayscales of the m adjacent pixels composing the pixel-group PG. In some exemplary embodiments, the unit grayscale to be implemented by the pixel-group PG may be determined as a weighted average of the grayscales of the m adjacent pixels composing the pixel-group PG.

Here, the method of FIG. 1 may perform the normal driving that implements the unit grayscale by controlling all of the m adjacent pixels to emit light with the first luminance corresponding to the respective data signals (S130) when the unit grayscale to be implemented by the pixel-group PG is greater than or equal to the reference grayscale REFG. In other words, the method of FIG. 1 may perform the normal driving (i.e., indicated by NORMAL DRIVING) that controls each of the m adjacent pixels composing the pixel-group PG to emit light based on the data signal applied to each of the m adjacent pixels. For example, as illustrated in FIGS. 2A, 3A, and 4A, when the unit grayscale to be implemented by the pixel-group PG is greater than or equal to the reference grayscale REFG, each of the m adjacent pixels may emit light with the first luminance corresponding to the data signal applied to each of the m adjacent pixels so that each of the m adjacent pixels may implement its grayscale. Thus, the pixel-group PG including the m adjacent pixels may implement the unit grayscale.

On the other hand, the method of FIG. 1 may perform the combination driving that implements the unit grayscale by controlling only a portion of the m adjacent pixels to emit light with the second luminance that is greater than the first luminance (S140) when the unit grayscale to be implemented by the pixel-group PG is not greater than or equal to the reference grayscale REFG (e.g., when the unit grayscale to be implemented by the pixel-group PG is less than the reference grayscale REFG). In other words, when the unit grayscale to be implemented by the pixel-group PG is less than the reference grayscale REFG, the method of FIG. 1 may perform the combination driving (i.e., indicated by COMBINATION DRIVING) that controls only a portion of the m adjacent pixels to emit light with the second luminance corresponding to respective amplified signals of the data signals applied to the portion of the m adjacent pixels, where the second luminance is greater than the first luminance corresponding to the data signals applied to the portion of the m adjacent pixels and that controls the rest not to emit light. Thus, a current flowing through the organic light emitting element included in each pixel that implements the low-grayscale may be increased so that the current may be accurately controlled. As a result, the low-grayscale stain may be effectively removed without data compensation that uses an optical imaging technique.

In some exemplary embodiments, when performing the combination driving is performed as the unit grayscale to be implemented by the pixel-group PG is less than the reference grayscale REFG, the method of FIG. 1 may select n adjacent pixels, where "n" is an integer greater than or equal to 1 and less than m, among the m adjacent pixels (i.e., the portion of the m adjacent pixels) and may control the second luminance to be m/n times the first luminance, where the n adjacent pixels emit light with the second luminance. Here, when performing the combination driving as the unit grayscale to be implemented by the pixel-group PG is less than the reference grayscale REFG, the method of FIG. 1 may differently and alternately select the n adjacent pixels among the m adjacent pixels (i.e., the portion of the m adjacent pixels) for respective frames to alternate a light emitting pattern of the pixel-group PG for the frames. Thus, the method of FIG. 1 may achieve a temporal distribution effect by differently and alternately selecting the n adjacent pixels among the m adjacent pixels composing the pixel-group PG for respective frames. As a result, the method of FIG. 1 may prevent (or reduce) a recognition resolution loss caused by selecting the n adjacent pixels among the m adjacent pixels composing the pixel-group PG. In other words, the method of FIG. 1 may prevent a viewer (or user) from recognizing a resolution loss caused by non-emission pixels of the pixel-group PG by alternating the light emitting pattern of the pixel-group PG for respective frames.

As described above, when the display panel includes the blue color pixels B, the red color pixels R, and the green color pixels G, the method of FIG. 1 may separately (or independently) perform the combination driving for the blue color pixels B, the red color pixels R, and the green color pixels G. In addition, when the display panel includes the blue color pixels B, the red color pixels R, the green color pixels G, and the white color pixels W, the method of FIG. 1 may separately (or independently) perform the combination driving for the blue color pixels B, the red color pixels R, the green color pixels G, and the white color pixels W. Hereinafter, examples in which the method of FIG. 1 performs the combination driving on the green color pixels G will be described.

For example, as illustrated in FIGS. 2A and 2B, when the combination driving is performed as the unit grayscale to be implemented by the pixel-group PG is less than the reference grayscale REFG, a portion (e.g., two green color pixels G) of four green color pixels G composing the pixel-group PG may be selected. Here, the second luminance with which the two green color pixels G emit light may be two times the first luminance (i.e., indicated by X2). That is, the method of FIG. 1 may control only the two green color pixels G of the four green color pixels G composing the pixel-group PG to emit light. Here, the method of FIG. 1 may control each of the two green color pixels G to emit light with the second luminance that is two times the first luminance corresponding to an applied data signal. Thus, because a current that is two times a current corresponding to the applied data signal flows through the organic light emitting element included in each of the two green color pixels G, each of the two green color pixels G may emit light with the second luminance that is two times the first luminance. As a result, the method of FIG. 1 may allow the pixel-group PG to implement the unit grayscale while controlling only two green color pixels G of the four green color pixels G composing the pixel-group PG to emit light.

Here, when the combination driving is performed as the unit grayscale to be implemented by the pixel-group PG is less than the reference grayscale REFG, the method of FIG. 1 may differently and alternately select the two green color pixels G among the four green color pixels G composing the pixel-group PG for respective frames to alternate the light emitting pattern of the pixel-group PG for the frames. For example, as illustrated in FIG. 2B, the two green color pixels G corresponding to a first light emitting pattern may be selected for a first frame (i.e., indicated by 1ST FRAME), and the two green color pixels G corresponding to a second light emitting pattern may be selected for a second frame (i.e., indicated by 2ND FRAME). That is, since the two green color pixels G (i.e., two pixels) are selected among the four green color pixels G (i.e., four adjacent pixels) composing the pixel-group PG, the number of cases may be calculated by the combination calculation formula, $C(n,r)=n!/(r!(n-r)!)$, e.g., $C(4,2)=6$. Thus, the method of FIG. 1 may maximally alternate six light emitting patterns for six frames.

For example, as illustrated in FIGS. 3A and 3B, when the combination driving is performed as the unit grayscale to be implemented by the pixel-group PG is less than the reference grayscale REFG, a portion (e.g., one green color pixel G) of four green color pixels G composing the pixel-group PG may be selected. Here, the second luminance with which the one green color pixel G emits light may be four times the first luminance (i.e., indicated by X4). That is, the method of FIG. 1 may control only the one green color pixel G of the four green color pixels G composing the pixel-group PG to emit light. Here, the method of FIG. 1 may control the one green color pixel G to emit light with the second luminance that is four times the first luminance corresponding to an applied data signal. Thus, because a current that is four times a current corresponding to the applied data signal flows through the organic light emitting element included in the one green color pixel G, the one green color pixel G may emit light with the second luminance that is four times the first luminance. As a result, the method of FIG. 1 may allow the pixel-group PG to implement the unit grayscale while controlling only one green color pixel G of the four green color pixels G composing the pixel-group PG to emit light.

Here, when the combination driving is performed as the unit grayscale to be implemented by the pixel-group PG is less than the reference grayscale REFG, the method of FIG. 1 may differently and alternately select the one green color pixel G among the four green color pixels G composing the pixel-group PG for respective frames to alternate the light emitting pattern of the pixel-group PG for the frames. For example, as illustrated in FIG. 3B, the one green color pixel G corresponding to a first light emitting pattern may be selected for a first frame (i.e., indicated by 1ST FRAME), the one green color pixel G corresponding to a second light emitting pattern may be selected for a second frame (i.e., indicated by 2ND FRAME), the one green color pixel G corresponding to a third light emitting pattern may be selected for a third frame (i.e., indicated by 3RD FRAME), and the one green color pixel G corresponding to a fourth light emitting pattern may be selected for a fourth frame (i.e., indicated by 4TH FRAME). That is, since the one green color pixel G (i.e., one pixel) is selected among the four green color pixels G (i.e., four adjacent pixels) composing the pixel-group PG, the number of cases may be calculated by the combination calculation formula, $C(4,1)=4$. Thus, the method of FIG. 1 may maximally alternate four light emitting patterns for four frames.

For example, as illustrated in FIGS. 4A and 4B, when the combination driving is performed as the unit grayscale to be implemented by the pixel-group PG is less than the reference grayscale REFG, a portion (e.g., four green color pixels G) of six green color pixels G composing the pixel-group PG may be selected. Here, the second luminance with which the four green color pixels G emit light may be 1.5 times the first luminance (i.e., indicated by X1.5). That is, the method of FIG. 1 may control only the four green color pixels G of the six green color pixels G composing the pixel-group PG to emit light. Here, the method of FIG. 1 may control each of the four green color pixels G to emit light with the second luminance that is 1.5 times the first luminance corresponding to an applied data signal. Thus, because a current that is 1.5 times a current corresponding to the applied data signal flows through the organic light emitting element included in each of the four green color pixels G, each of the four green color pixels G may emit light with the second luminance that is 1.5 times the first luminance. As a result, the method of FIG. 1 may allow the pixel-group PG to implement the unit grayscale while controlling only four green color pixels G of the six green color pixels G composing the pixel-group PG to emit light.

Here, when the combination driving is performed as the unit grayscale to be implemented by the pixel-group PG is less than the reference grayscale REFG, the method of FIG. 1 may differently and alternately select the four green color pixels G among the six green color pixels G composing the pixel-group PG for respective frames to alternate the light emitting pattern of the pixel-group PG for the frames. For example, as illustrated in FIG. 4B, the four green color pixels G corresponding to a first light emitting pattern may be selected for a first frame (i.e., indicated by 1ST FRAME), the four green color pixels G corresponding to a second light emitting pattern may be selected for a second frame (i.e., indicated by 2ND FRAME), and the four green color pixels G corresponding to a third light emitting pattern may be selected for a third frame (i.e., indicated by 3RD FRAME). That is, since the four green color pixels G (i.e., four pixels) are selected among the six green color pixels G (i.e., six adjacent pixels) composing the pixel-group PG, the number of cases may be calculated by the combination calculation formula, $C(6,4)=15$. Thus, the method of FIG. 1 may maximally alternate fifteen light emitting patterns for fifteen frames.

In brief, the method of FIG. 1 may drive the display panel by grouping the m adjacent pixels, which output the same color light, into one pixel-group PG in the display panel, by implementing the unit grayscale of the pixel-group PG by controlling all of the m adjacent pixels to emit light with the first luminance corresponding to the respective data signals when the unit grayscale to be implemented by the pixel-group PG is greater than or equal to the reference grayscale REFG, and by implementing the unit grayscale of the pixel-group PG by controlling only the portion (e.g., the n adjacent pixels) of the m adjacent pixels to emit light with the second luminance that is greater than the first luminance corresponding to the respective data signals when the unit grayscale to be implemented by the pixel-group PG is less than the reference grayscale REFG. Thus, the method of FIG. 1 may effectively remove the low-grayscale stain without data compensation that uses an optical imaging technique.

Although the method of FIG. 1 is described focusing on the green color pixels G that output the green color light in FIGS. 2A to 4B, it should be understood that the method of FIG. 1 separately (or independently) performs the steps S110, S120, S125, S130, and S140 on the red color pixels R that emit the red color light, the blue color pixels B that emit the blue color light, and the green color pixels G that emit the green color light. In some exemplary embodiments, when the combination driving is separately performed on the red color pixels R, the blue color pixels B, and the green color pixels G, the method of FIG. 1 may determine the range and location of the pixel-group PG including the red color pixels R, the range and location of the pixel-group PG including the blue color pixels B, and the range and location of the pixel-group PG including the green color pixels G, independently of each other. In some exemplary embodiments, when the combination driving is separately performed on the red color pixels R, the blue color pixels B, and the green color pixels G, the method of FIG. 1 may determine the range and location of the pixel-group PG including the red color pixels R, the range and location of the pixel-group PG including the blue color pixels B, and the range and location of the pixel-group PG including the green color pixels G, dependently of each other.

Figure 6:
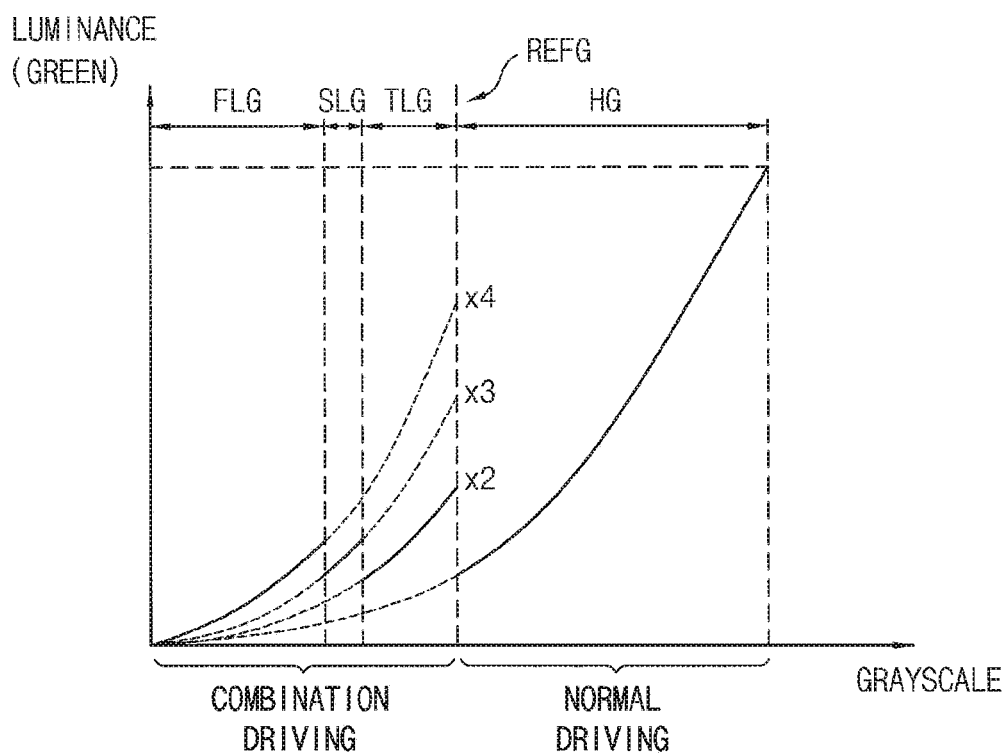
FIG. 6 is a graph illustrating an example of a combination driving that is performed by the method of FIG. 5 according to some exemplary embodiments.
Figure 7:
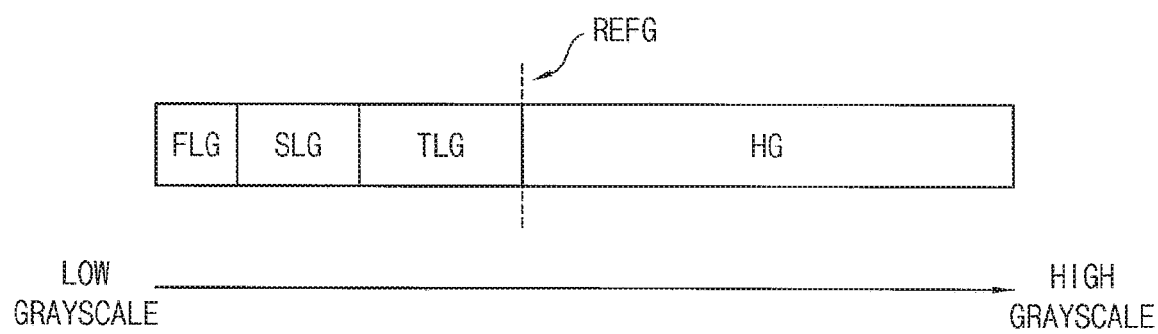
FIG. 7 is a diagram illustrating an example of a combination driving that is performed by the method of FIG. 5 according to some exemplary embodiments.

FIG. 5 is a flowchart illustrating a method of driving a display panel according to some exemplary embodiments. FIG. 6 is a graph illustrating an example of a combination driving that is performed by the method of FIG. 5 according to some exemplary embodiments. FIG. 7 is a diagram illustrating an example of a combination driving that is performed by the method of FIG. 5 according to some exemplary embodiments.

Referring to FIGS. 5 to 7, the method of FIG. 5 may group m adjacent pixels, which output the same color light, into one pixel-group in the display panel (S210), may determine whether a unit grayscale to be implemented by the pixel-group is greater than or equal to a reference grayscale REFG (S225) by analyzing respective data signals applied to the pixel-group (S220), may perform a normal driving that implements the unit grayscale by controlling all of the m adjacent pixels to emit light with first luminance corresponding to the respective data signals (S230) when the unit grayscale to be implemented by the pixel-group belongs to a high-grayscale region HG that is greater than or equal to the reference grayscale REFG, and may perform a combination driving that implements the unit grayscale by controlling only n adjacent pixels of the m adjacent pixels to emit light with second luminance that is m/n times the first luminance (S240) when the unit grayscale to be implemented by the pixel-group belongs to first through (k)-th low-grayscale regions FLG, SLG, and TLG that are less than the reference grayscale REFG, where k is an integer greater than or equal to 2. Here, n and m may be differently determined for the first through (k)-th low-grayscale regions FLG, SLG, and TLG.

In some exemplary embodiments, when the display panel includes blue color pixels, red color pixels, and green color pixels, the method of FIG. 5 may separately (or independently) perform the steps S210, S220, S225, S230, and S240 for the blue color pixels, the red color pixels, and the green color pixels. In some exemplary embodiments, when the display panel includes blue color pixels, red color pixels, green color pixels, and white color pixels, the method of FIG. 5 may separately perform the steps S210, S220, S225, S230, and S240 for the blue color pixels, the red color pixels, the green color pixels, and the white color pixels. For convenience of description, in FIGS. 5 to 7, the method of FIG. 5 will be described focusing on the green color pixels.

Except that the method of FIG. 5 drives the display panel by dividing a region where the unit grayscale to be implemented by the pixel-group is less than the reference grayscale REFG into a plurality of sub-regions (e.g., the first through (k)-th low-grayscale regions FLG, SLG, and TLG), the method of FIG. 5 may be substantially the same as the method of FIG. 1. Thus, duplicated description of the method of FIG. 1 will not be repeated in describing the method of FIG. 5. In addition, for convenience of description, it will be assumed in FIGS. 6 and 7 that k is 3. That is, it will be assumed that the region where the unit grayscale to be implemented by the pixel-group is less than the reference grayscale REFG is divided into the first through third low-grayscale regions FLG, SLG, and TLG. Since these exemplary embodiments are examples, it is to be understood that the region where the unit grayscale to be implemented by the pixel-group is less than the reference grayscale REFG may be divided into two or more low-grayscale regions according to aspects of the display panel.

As described above, the method of FIG. 5 may group the m adjacent pixels, which output the same color light, into one pixel-group in the display panel (S210), and may determine whether the unit grayscale to be implemented by the pixel-group is greater than or equal to the reference grayscale REFG (S225) by analyzing the respective data signals applied to the pixel-group (S220). Here, the reference grayscale REFG may be determined as a given grayscale at which it is determined that accurately controlling a current flowing through an organic light emitting element included in each pixel is possible. In addition, the unit grayscale to be implemented by the pixel-group may be determined based on grayscales to be implemented by the m adjacent pixels composing the pixel-group.

Here, the method of FIG. 5 may perform the normal driving that implements the unit grayscale by controlling all of the m adjacent pixels to emit light with the first luminance corresponding to the respective data signals (S230) when the unit grayscale to be implemented by the pixel-group belongs to the high-grayscale region HG that is greater than or equal to the reference grayscale REFG. In other words, the method of FIG. 5 may perform the normal driving (i.e., indicated by NORMAL DRIVING) that controls each of the m adjacent pixels composing the pixel-group to emit light based on the data signal applied to each of the m adjacent pixels.

On the other hand, the method of FIG. 5 may perform the combination driving that implements the unit grayscale by controlling the n adjacent pixels of the m adjacent pixels to emit light with the second luminance that is m/n times the first luminance (S240) when the unit grayscale to be implemented by the pixel-group belongs to the first through third low-grayscale regions FLG, SLG, and TLG that are less than the reference grayscale REFG. In other words, when the unit grayscale to be implemented by the pixel-group belongs to the first through third low-grayscale regions FLG, SLG, and TLG that are less than the reference grayscale REFG, the method of FIG. 5 may perform the combination driving (i.e., indicated by COMBINATION DRIVING) that controls only a portion (e.g., the n adjacent pixels) of the m adjacent pixels to emit light with the second luminance corresponding to respective amplified signals of the data signals applied to the portion of the m adjacent pixels, where the second luminance is greater than (e.g., m/n times) the first luminance corresponding to the data signals applied to the portion of the m adjacent pixels and that controls the rest not to emit light. Here, the method of FIG. 5 may differently determine n and m for the first through third low-grayscale regions FLG, SLG, and TLG, and thus, may perform a different combination driving for each of the first through third low-grayscale regions FLG, SLG, and TLG. In some exemplary embodiments, when performing the combination driving as the unit grayscale to be implemented by the pixel-group is less than the reference grayscale REFG, the method of FIG. 5 may differently and alternately select the n adjacent pixels among the m adjacent pixels for respective frames to alternate a light emitting pattern of the pixel-group for the frames.

For example, as illustrated in FIGS. 6 and 7, the method of FIG. 5 may perform, in the first low-grayscale region FLG, a first combination driving (e.g., m=4 and n=1) that implements the unit grayscale by grouping four adjacent pixels into one pixel-group and by controlling only one adjacent pixel of the four adjacent pixels to emit light with the second luminance that is four times the first luminance (i.e., indicated by X4), may perform, in the second low-grayscale region SLG, a second combination driving (e.g., m=3 and n=1) that implements the unit grayscale by grouping three adjacent pixels into one pixel-group and by controlling only one adjacent pixel of the three adjacent pixels to emit light with the second luminance that is three times the first luminance (i.e., indicated by X3), and may perform, in the third low-grayscale region TLG, a third combination driving (e.g., m=2 and n=1) that implements the unit grayscale by grouping two adjacent pixels into one pixel-group and by controlling only one adjacent pixel of the two adjacent pixels to emit light with the second luminance that is two times the first luminance (i.e., indicated by X2).

Because the current flowing through the organic light emitting element included in each pixel is the smallest in the first low-grayscale region FLG among the first through third low-grayscale regions FLG, SLG, and TLG, the method of FIG. 5 may maximally amplify the current flowing through the organic light emitting element included in an emission pixel (i.e., luminance of the emission pixel) for the first low-grayscale region FLG. Because the current flowing through the organic light emitting element included in each pixel is the largest in the third low-grayscale region TLG among the first through third low-grayscale regions FLG, SLG, and TLG, the method of FIG. 5 may minimally amplify the current flowing through the organic light emitting element included in an emission pixel (i.e., luminance of the emission pixel) for the third low-grayscale region TLG. Because the current flowing through the organic light emitting element included in each pixel in the second low-grayscale region SLG is between the current flowing through the organic light emitting element included in each pixel in the first low-grayscale region FLG and the current flowing through the organic light emitting element included in each pixel in the third low-grayscale region TLG, the method of FIG. 5 may moderately amplify the current flowing through the organic light emitting element included in an emission pixel (i.e., luminance of the emission pixel) for the second low-grayscale region SLG. Since the first through third low-grayscale regions FLG, SLG, and TLG illustrated in FIGS. 6 and 7 are examples, the number of the first through (k)-th low-grayscale regions and n and m determined for the first through (k)-th low-grayscale regions may be changed according to aspects of the display panel.

In brief, the method of FIG. 5 may drive the display panel by grouping the m adjacent pixels, which output the same color light, into one pixel-group in the display panel, by implementing the unit grayscale of the pixel-group by controlling all of the m adjacent pixels to emit light with the first luminance corresponding to the respective data signals when the unit grayscale to be implemented by the pixel-group is greater than or equal to the reference grayscale REFG, and by implementing the unit grayscale of the pixel-group by controlling only a portion (e.g., the n adjacent pixels) of the m adjacent pixels to emit light with the second luminance that is greater than the first luminance corresponding to the respective data signals when the unit grayscale to be implemented by the pixel-group is less than the reference grayscale REFG. Here, the method of FIG. 5 may divide the region where the unit grayscale to be implemented by the pixel-group is less than the reference grayscale REFG into the first through (k)-th low-grayscale regions FLG, SLG, and TLG, may differently determine n and m for the first through (k)-th low-grayscale regions FLG, SLG, and TLG, and may perform a different combination driving for each of the first through (k)-th low-grayscale regions FLG, SLG, and TLG. Thus, the method of FIG. 5 may effectively remove the low-grayscale stain without data compensation that uses an optical imaging technique.

Although the method of FIG. 5 is described focusing on the green color pixels G in FIGS. 5 to 7, it should be understood that the method of FIG. 5 separately (or independently) performs the steps S210, S220, S225, S230, and S240 on the red color pixels R, the blue color pixels B, and the green color pixels G. In some exemplary embodiments, when the combination driving is separately performed on the red color pixels R, the blue color pixels B, and the green color pixels G, the method of FIG. 5 may determine the range and location of the pixel-group including the red color pixels R, the range and location of the pixel-group including the blue color pixels B, and the range and location of the pixel-group including the green color pixels G, independently of each other. In some exemplary embodiments, when the combination driving is separately performed on the red color pixels R, the blue color pixels B, and the green color pixels G, the method of FIG. 5 may determine the range and location of the pixel-group PG including the red color pixels R, the range and location of the pixel-group PG including the blue color pixels B, and the range and location of the pixel-group PG including the green color pixels G, dependently of each other.

Figure 8:
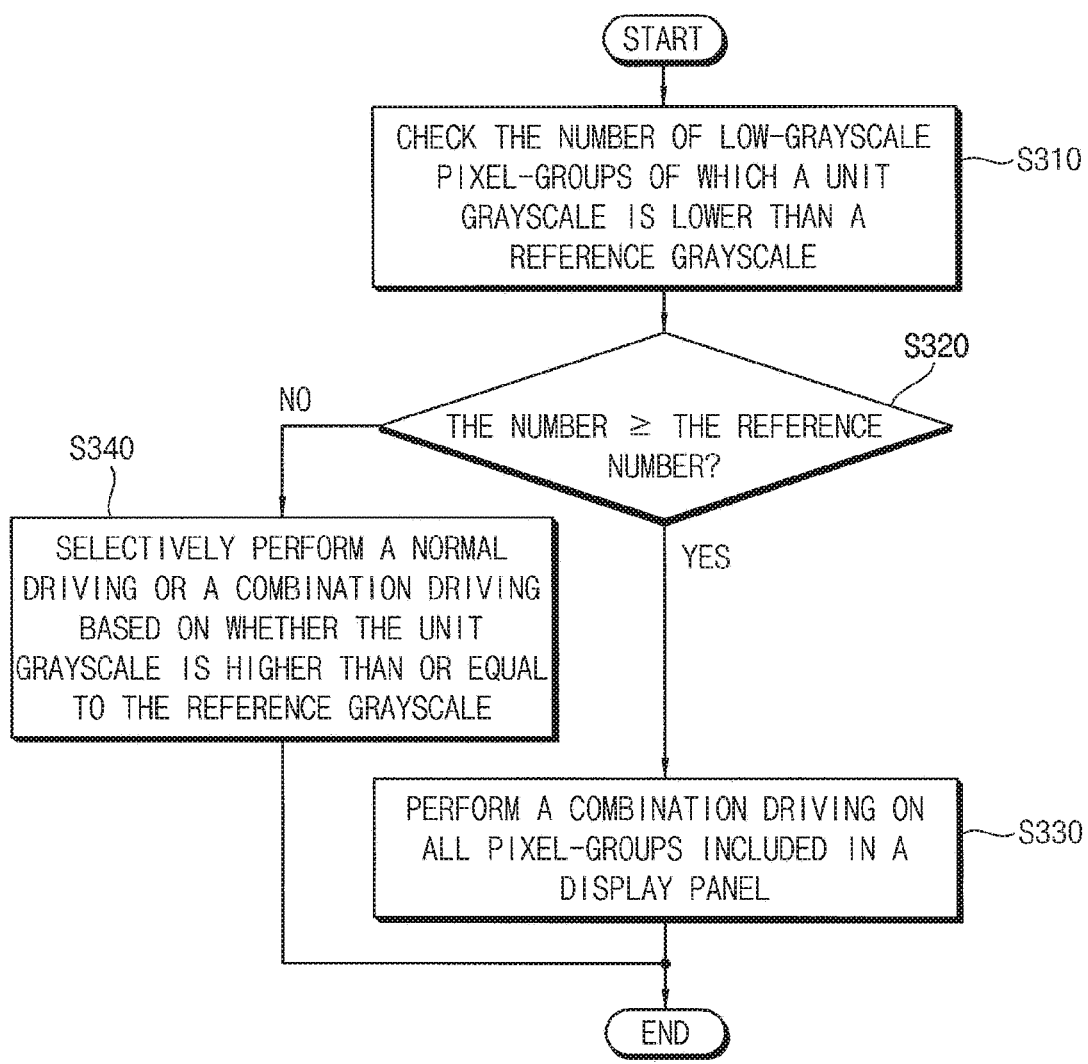
FIG. 8 is a flowchart illustrating a method of driving a display panel according to some exemplary embodiments.

FIG. 8 is a flowchart illustrating a method of driving a display panel according to some exemplary embodiments.

Referring to FIG. 8, the method of FIG. 8 may apply the same driving method to both low-grayscale pixel-groups of which a unit grayscale is less than a reference grayscale and high-grayscale pixel-groups of which the unit grayscale is greater than or equal to the reference grayscale in some situations. For instance, the method of FIG. 8 may check the number of the low-grayscale pixel-groups of which the unit grayscale is less than the reference grayscale (S310), and may check whether the number of the low-grayscale pixel-groups is greater than or equal to a reference number (S320). Here, when the number of the low-grayscale pixel-groups is greater than or equal to the reference number, the method of FIG. 8 may perform a combination driving on all pixel-groups included in a display panel (S330). On the other hand, when the number of the low-grayscale pixel-groups is smaller than the reference number, the method of FIG. 8 may selectively perform a normal driving or a combination driving on each pixel-group based on whether the unit grayscale to be implemented by the pixel-group is greater than or equal to the reference grayscale (S340). Generally, when most pixel-groups are the low-grayscale pixel-groups of which the unit grayscale is less than the reference grayscale in the display panel, applying the same driving method to all pixel-groups included in the display panel may be more advantageous (e.g., driving load reduction) than applying different driving methods to the high-grayscale pixel-groups of which the unit grayscale is greater than or equal to the reference grayscale and the low-grayscale pixel-groups of which the unit grayscale is less than the reference grayscale. Thus, the method of FIG. 8 may perform the combination driving on all pixel-groups included in the display panel when the number of the low-grayscale pixel-groups of which the unit grayscale is less than the reference grayscale is greater than or equal to the reference number in the display panel (e.g., a low-grayscale image).

Figure 9:
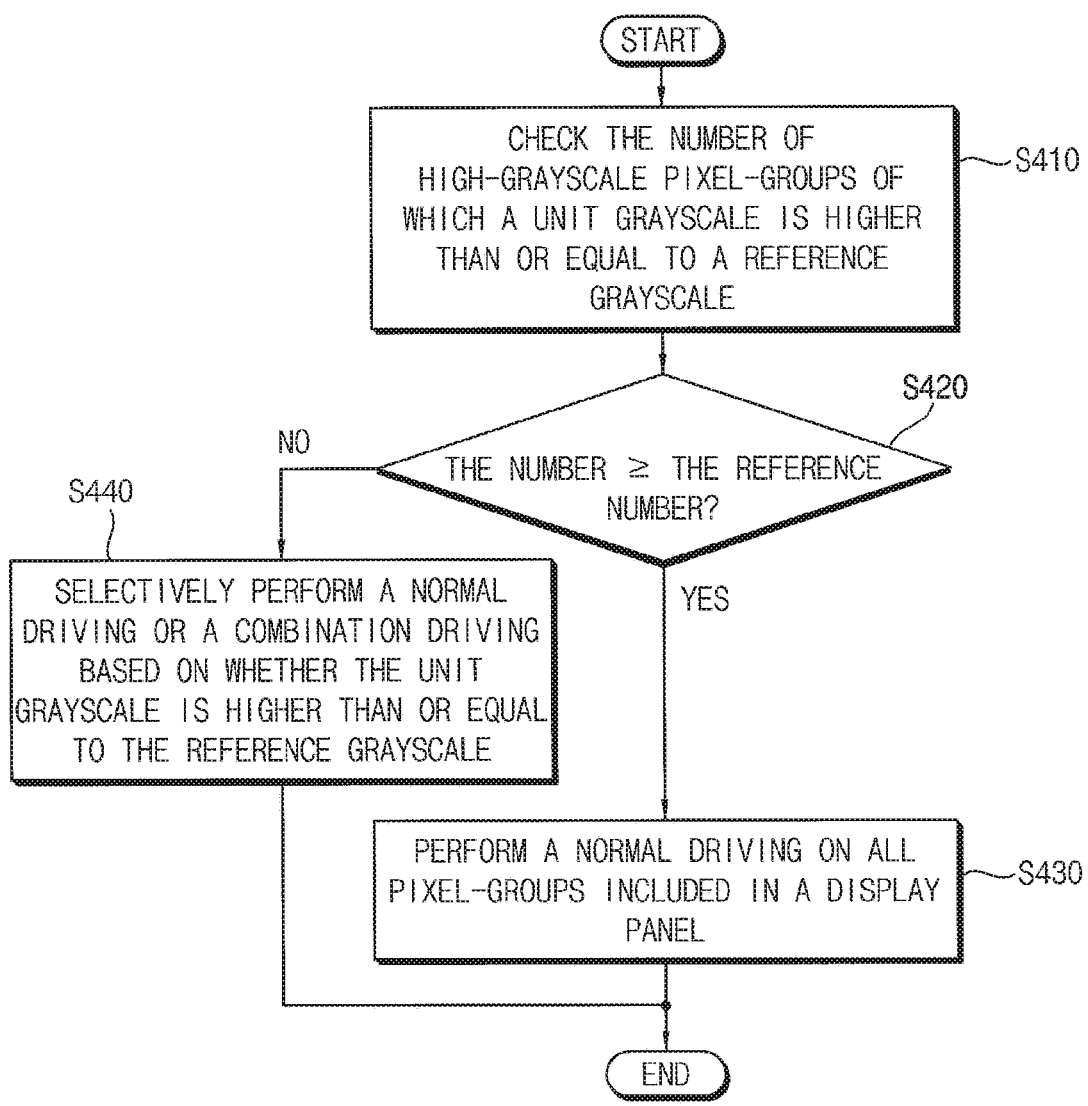
FIG. 9 is a flowchart illustrating a method of driving a display panel according to some exemplary embodiments.

FIG. 9 is a flowchart illustrating a method of driving a display panel according to some exemplary embodiments.

Referring to FIG. 9, the method of FIG. 9 may apply the same driving method to both low-grayscale pixel-groups of which a unit grayscale is less than a reference grayscale and high-grayscale pixel-groups of which the unit grayscale is greater than or equal to the reference grayscale in some situations. For example, the method of FIG. 9 may check the number of the high-grayscale pixel-groups of which the unit grayscale is greater than or equal to the reference grayscale (S410) and may check whether the number of the high-grayscale pixel-groups is greater than or equal to a reference number (S420). Here, when the number of the high-grayscale pixel-groups is greater than or equal to the reference number, the method of FIG. 9 may perform a normal driving on all pixel-groups included in a display panel (S430). On the other hand, when the number of the high-grayscale pixel-groups is smaller than the reference number, the method of FIG. 9 may selectively perform a normal driving or a combination driving on each pixel-group based on whether the unit grayscale to be implemented by the pixel-group is greater than or equal to the reference grayscale (S440). Generally, when most pixel-groups are the high-grayscale pixel-groups of which the unit grayscale is greater than or equal to the reference grayscale in the display panel, applying the same driving method to all pixel-groups included in the display panel may be more advantageous (e.g., driving load reduction) than applying different driving methods to the high-grayscale pixel-groups of which the unit grayscale is greater than or equal to the reference grayscale and the low-grayscale pixel-groups of which the unit grayscale is less than the reference grayscale. Thus, the method of FIG. 9 may perform the normal driving on all pixel-groups included in the display panel when the number of the high-grayscale pixel-groups of which the unit grayscale is greater than or equal to the reference grayscale is greater than or equal to the reference number in the display panel (e.g., a high-grayscale image).

Figure 10:
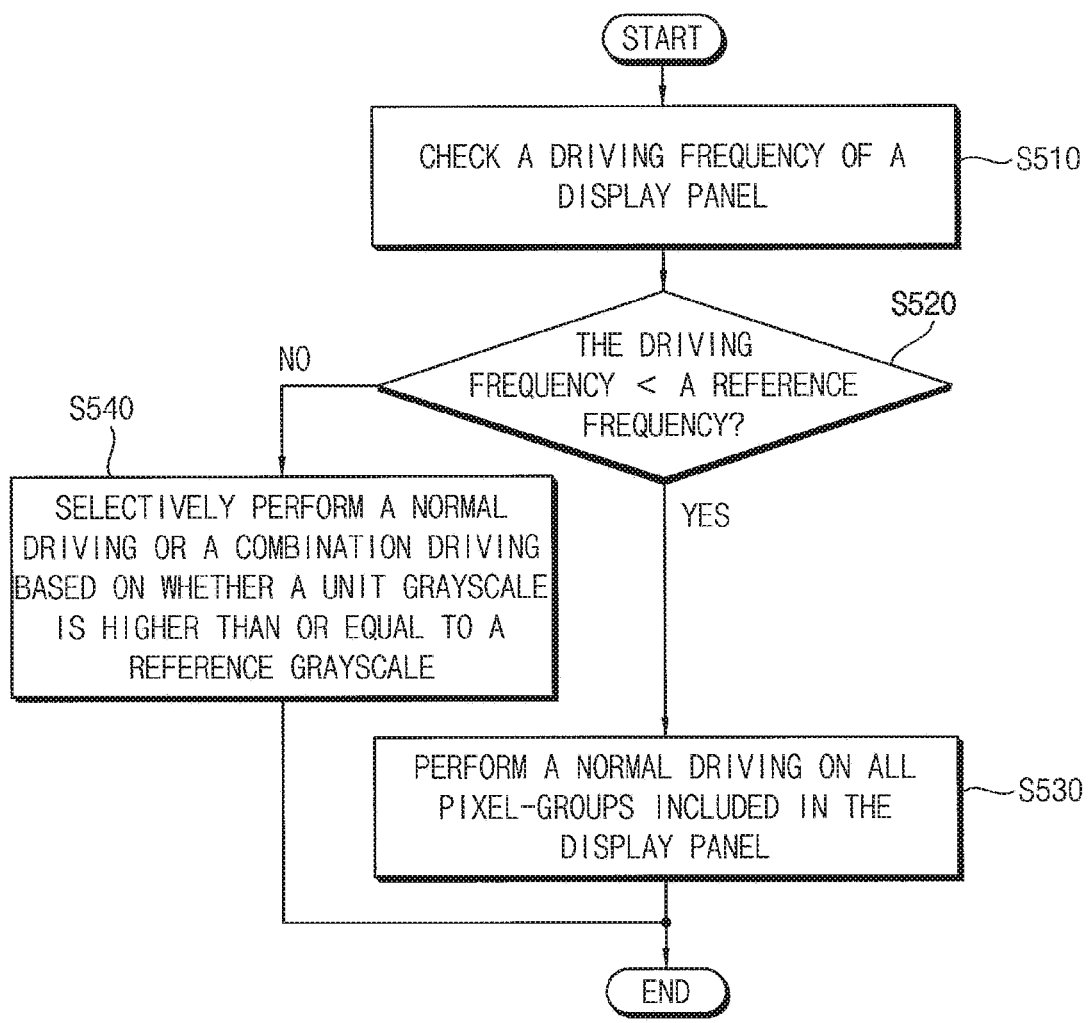
FIG. 10 is a flowchart illustrating a method of driving a display panel according to some exemplary embodiments.

FIG. 10 is a flowchart illustrating a method of driving a display panel according to some exemplary embodiments.

Referring to FIG. 10, the method of FIG. 10 may not perform a combination driving on low-grayscale pixel-groups of which a unit grayscale is less than a reference grayscale in some situations. For example, the method of FIG. 10 may check a driving frequency of a display panel (S510) and may check whether the driving frequency of the display panel is less than a reference frequency (S520). Here, when the driving frequency of the display panel is less than the reference frequency, the method of FIG. 10 may perform a normal driving on all pixel-groups included in the display panel (S530). That is, when the driving frequency of the display panel is less than the reference frequency, the method of FIG. 10 may not perform the combination driving even on the low-grayscale pixel-groups of which the unit grayscale is less than the reference grayscale. Generally, when the combination driving is performed in a situation that the driving frequency of the display panel is less than the reference frequency, a viewer can recognize a resolution loss because a temporal distribution effect is not achieved even when a light emitting pattern of each pixel-group is alternated for frames. Thus, the method of FIG. 10 may perform the normal driving on all pixel-groups included in the display panel when the driving frequency of the display panel is less than the reference frequency. On the other hand, when the driving frequency of the display panel is greater than or equal to the reference frequency, the method of FIG. 10 may selectively perform the normal driving or the combination driving on each pixel-group based on whether the unit grayscale to be implemented by the pixel-group is greater than or equal to the reference grayscale.

Figure 11:
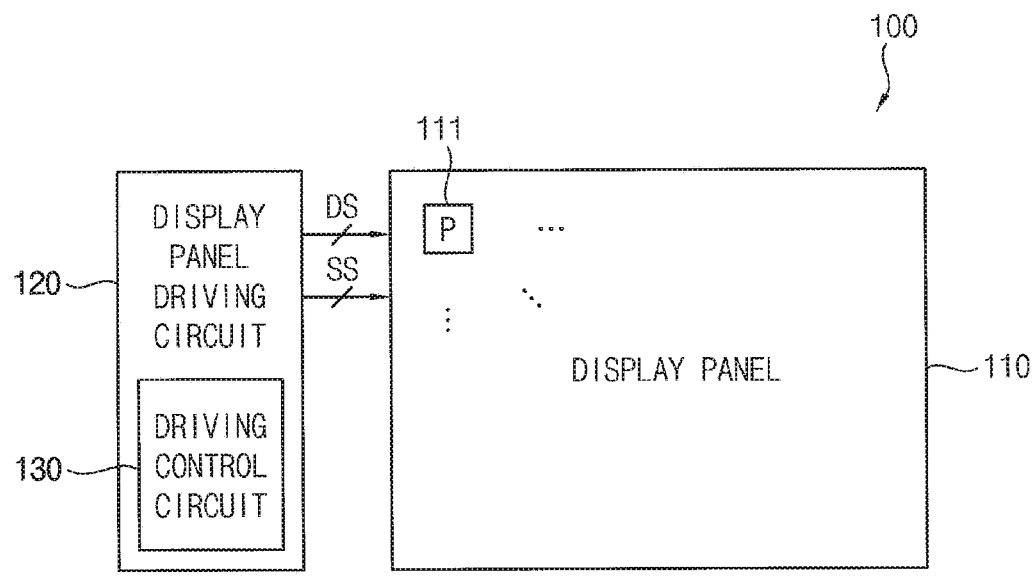
FIG. 11 is a block diagram illustrating an organic light emitting display device according to some exemplary embodiments.
Figure 12:
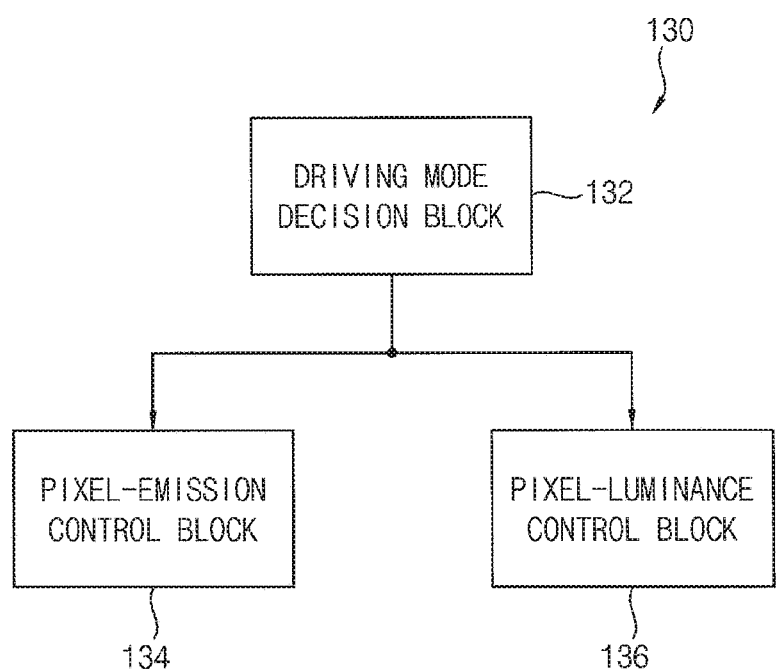
FIG. 12 is a block diagram illustrating a driving control circuit included in the organic light emitting display device of FIG. 11 according to some exemplary embodiments.

FIG. 11 is a block diagram illustrating an organic light emitting display device according to some exemplary embodiments. FIG. 12 is a block diagram illustrating a driving control circuit included in the organic light emitting display device of FIG. 11 according to some exemplary embodiments.

Referring to FIGS. 11 and 12, the organic light emitting display device 100 may include a display panel 110, a display panel driving circuit 120, and a driving control circuit 130.

The display panel 110 may include a plurality of pixels 111 each having an organic light emitting element. In some exemplary embodiments, the pixels 111 may be arranged in a matrix form in the display panel 110. The display panel driving circuit 120 may drive the display panel 110. In some exemplary embodiments, although not illustrated, the display panel driving circuit 120 may include a scan driver, a data driver, and a timing controller. The display panel 110 may be connected to the scan driver via scan-lines (not shown). The display panel 110 may be connected to the data driver via data-lines (not illustrated). The scan driver may provide a scan signal SS to the pixels 111 included in the display panel 110 via the scan-lines. The data driver may provide a data signal DS to the pixels 111 included in the display panel 110 via the data-lines. The timing controller may control the scan driver, the data driver, etc. For this operation, the timing controller may generate a plurality of control signals to provide the control signals to the scan driver, the data driver, etc. In addition, the timing controller may receive image data from an external component (not shown), may perform a given processing (e.g., data compensation processing, etc.), and may provide processed image data to the data driver. In some exemplary embodiments, the organic light emitting display device 100 may further include an emission control driver (not illustrated). In this case, the emission control driver may be connected to the display panel 110 via emission control-lines (not shown). The emission control driver may provide an emission control signal to the pixels 111 included in the display panel 110 via the emission control-lines.

The driving control circuit 130 may group m adjacent pixels 111, which output the same color light, into one pixel-group in the display panel 110, and may selectively perform a normal driving that drives (or operates) all of the m adjacent pixels 111 or a combination driving that drives (or operates) only a portion of the m adjacent pixels 111 based on whether a unit grayscale to be implemented by the pixel-group is greater than or equal to a reference grayscale. Here, when the combination driving is performed, the driving control circuit 130 may differently and alternately select a portion of the m adjacent pixels 111 for respective frames to alternate a light emitting pattern of the pixel-group for the frames. In some exemplary embodiments, the driving control circuit 130 may be implemented in the display panel driving circuit 120. In some exemplary embodiments, the driving control circuit 130 may be implemented separately from the display panel driving circuit 120.

To selectively perform the normal driving or the combination driving based on whether the unit grayscale to be implemented by the pixel-group is greater than or equal to the reference grayscale, the driving control circuit 130 may include a driving mode decision block 132, a pixel-emission control block 134, and a pixel-luminance control block 136. The driving mode decision block 132 may group the m adjacent pixels 111, which output the same color light, into one pixel-group in the display panel 110, and may decide whether to perform the normal driving or to perform the combination driving by determining whether the unit grayscale to be implemented by the pixel-group is greater than or equal to the reference grayscale. In some exemplary embodiments, the driving mode decision block 132 may perform the normal driving on all pixel-groups included in the display panel 110 when a driving frequency of the display panel 110 is less than a reference frequency. Generally, when the combination driving is performed in a situation that the driving frequency of the display panel 110 is less than the reference frequency, a viewer may recognize a resolution loss because a temporal distribution effect is not achieved even when the light emitting pattern of the pixel-group is alternated for frames. Thus, the driving mode decision block 132 may perform the normal driving on all pixel-groups included in the display panel 110 when the driving frequency of the display panel 110 is less than the reference frequency.

In some situations, the driving mode decision block 132 may apply the same driving method to both the low-grayscale pixel-groups of which the unit grayscale is less than the reference grayscale and the high-grayscale pixel-groups of which the unit grayscale is greater than or equal to the reference grayscale. In some exemplary embodiments, the driving mode decision block 132 may perform the combination driving on all pixel-groups included in the display panel 110 when the number of the low-grayscale pixel-groups is greater than or equal to a reference number in the display panel 110. In other words, because applying the same driving method to both the high-grayscale pixel-groups and the low-grayscale pixel-groups may be more advantageous than applying different driving methods to the high-grayscale pixel-groups and the low-grayscale pixel-groups when most pixel-groups included in the display panel 110 are the low-grayscale pixel-groups, the driving mode decision block 132 may perform the combination driving on all pixel-groups included in the display panel 110 when the number of the low-grayscale pixel-groups is greater than or equal to the reference number in the display panel 110 (i.e., in case of a low-grayscale image). In some exemplary embodiments, the driving mode decision block 132 may perform the normal driving on all pixel-groups included in the display panel 110 when the number of the high-grayscale pixel-groups is greater than or equal to a reference number in the display panel 110. In other words, because applying the same driving method to both the high-grayscale pixel-groups and the low-grayscale pixel-groups may be more advantageous (e.g., driving load reduction, etc.) than applying different driving methods to the high-grayscale pixel-groups and the low-grayscale pixel-groups when most pixel-groups included in the display panel 110 are the high-grayscale pixel-groups, the driving mode decision block 132 may perform the normal driving on all pixel-groups included in the display panel 110 when the number of the high-grayscale pixel-groups is greater than or equal to the reference number in the display panel 110 (e.g., in case of a high-grayscale image).

In some exemplary embodiments, the driving control circuit 130 may perform the normal driving that implements the unit grayscale by controlling all of the m adjacent pixels 111 to emit light with first luminance corresponding to respective data signals when the unit grayscale to be implemented by the pixel-group is greater than or equal to the reference grayscale and may perform the combination driving that implements the unit grayscale by controlling only a portion (e.g., n adjacent pixels 111) of the m adjacent pixels 111 to emit light with second luminance that is m/n times the first luminance when the unit grayscale to be implemented by the pixel-group is less than the reference grayscale. In some exemplary embodiments, the driving control circuit 130 may perform the normal driving that implements the unit grayscale by controlling all of the m adjacent pixels 111 to emit light with first luminance corresponding to respective data signals when the unit grayscale to be implemented by the pixel-group belongs to a high-grayscale region that is greater than or equal to the reference grayscale, and may perform the combination driving that implements the unit grayscale by controlling only a portion (e.g., n adjacent pixels 111) of the m adjacent pixels 111 to emit is light with second luminance that is m/n times the first luminance when the unit grayscale to be implemented by the pixel-group belongs to first through (k)-th low-grayscale regions that are less than the reference grayscale. Here, n and m may be differently determined for the first through (k)-th low-grayscale regions. Since these features are described with reference to FIGS. 1 to 7, duplicated description will not be repeated.

Although it is described above that the organic light emitting display device 100 includes the display panel 110, the display panel driving circuit 120, and the driving control circuit 130, in some exemplary embodiments, the organic light emitting display device 100 may further include other components (e.g., a deterioration compensating circuit that performs deterioration compensation on the pixels 111 included in the display panel 110).

Figure 13:
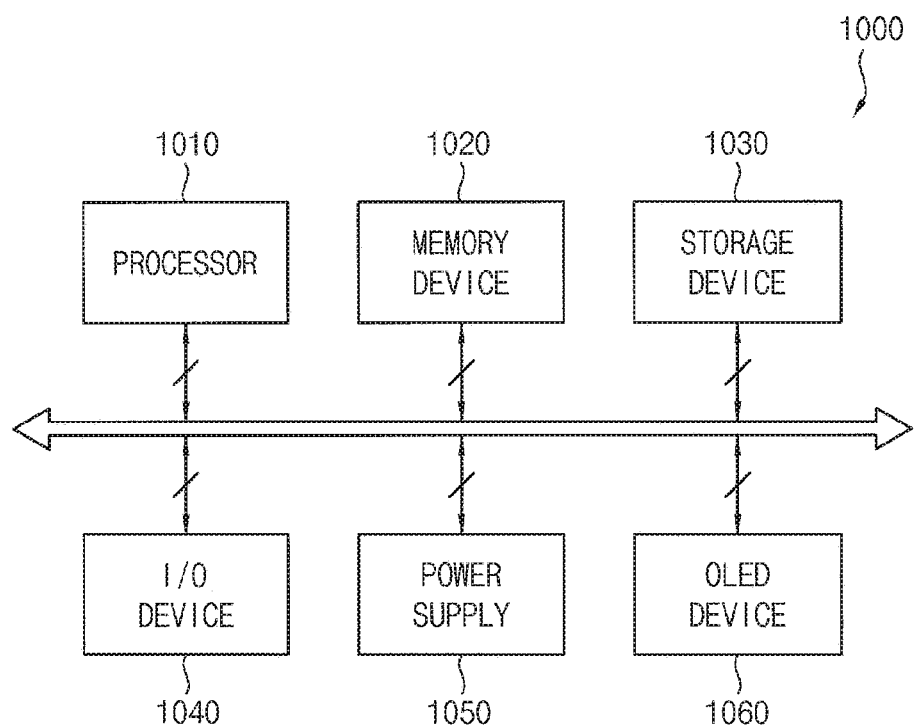
FIG. 13 is a block diagram illustrating an electronic device according to some exemplary embodiments.
Figure 14:
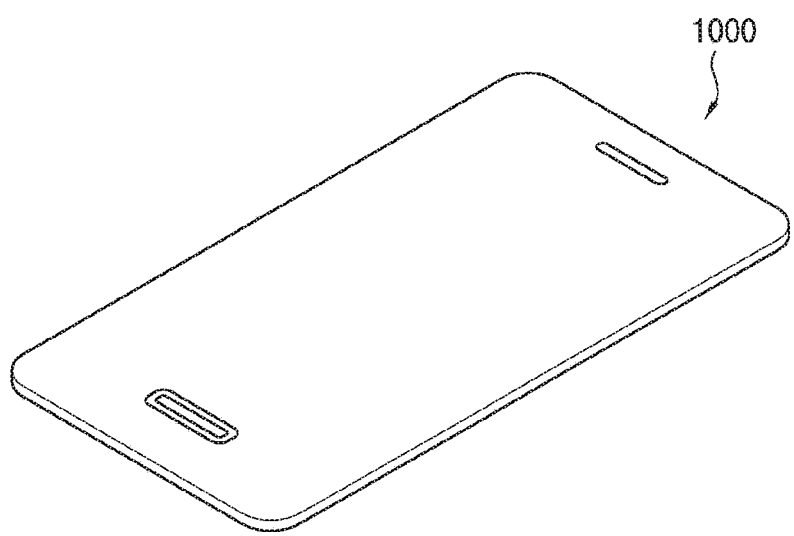
FIG. 14 is a diagram illustrating an example in which the electronic device of FIG. 13 is implemented as a smart phone according to some exemplary embodiments.
Figure 15:
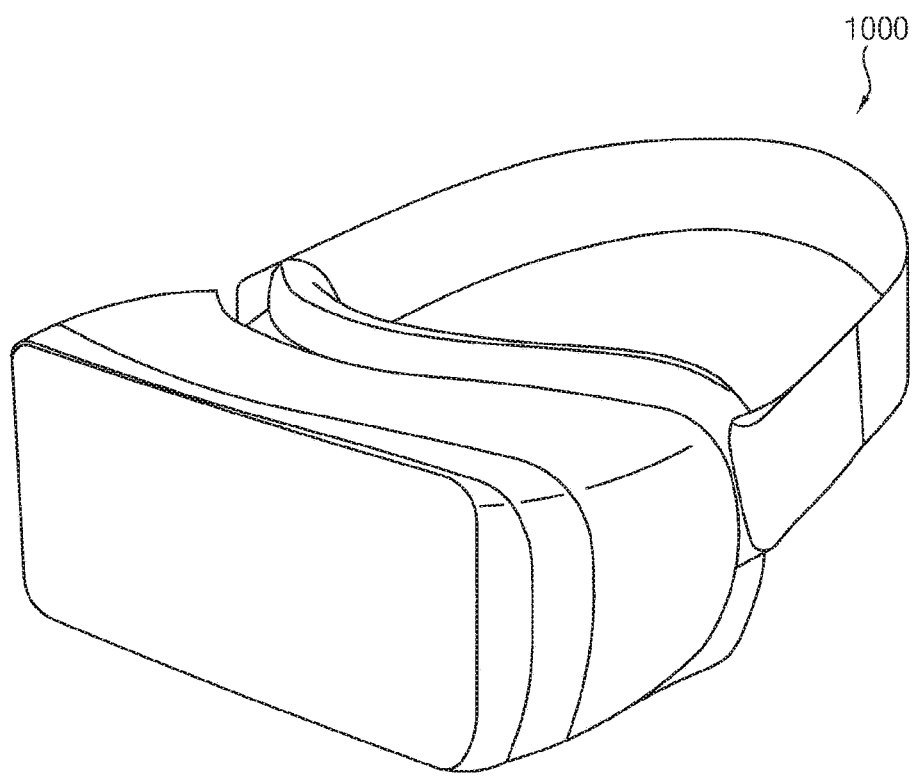
FIG. 15 is a diagram illustrating an example in which the electronic device of FIG. 13 is implemented as a head mounted display (HMD) device according to some exemplary embodiments.

FIG. 13 is a block diagram illustrating an electronic device according to some exemplary embodiments. FIG. 14 is a diagram illustrating an example in which the electronic device of FIG. 13 is implemented as a smart phone according to some exemplary embodiments. FIG. 15 is a diagram illustrating an example in which the electronic device of FIG. 13 is implemented as a head mounted display (HMD) device according to some exemplary embodiments.

Referring to FIGS. 13 to 15, the electronic device 1000 may include a processor 1010, a memory device 1020, a storage device 1030, an input/output (I/O) device 1040, a power supply 1050, and an organic light emitting display device 1060. Here, the organic light emitting display device 160 may be the organic light emitting display device 100 of FIG. 11. In addition, although not illustrated, the electronic device 1000 may further include a plurality of ports for communicating with a video card, a sound card, a memory card, a universal serial bus (USB) device, other electronic devices, etc. In some exemplary embodiments, as illustrated in FIG. 14, the electronic device 1000 may be implemented as a smart phone. In some exemplary embodiments, as illustrated in FIG. 15, the electronic device 1000 may be implemented as an HMD device. However, the electronic device 1000 is not limited thereto. For example, the electronic device 1000 may be implemented as a television, a cellular phone, a video phone, a smart pad, a smart watch, a tablet PC, a car navigation system, a computer monitor, a laptop, etc.

The processor 1010 may perform various computing functions. The processor 1010 may be a microprocessor, a central processing unit (CPU), an application processor (AP), etc. The processor 1010 may be coupled to other components via an address bus, a control bus, a data bus, etc. Further, the processor 1010 may be coupled to an extended bus, such as a peripheral component interconnection (PCI) bus. The memory device 1020 may store data for operations of the electronic device 1000. For example, the memory device 1020 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device, such as a dynamic random access memory (DRAM) device, a static random access memory (SRAM) device, a mobile DRAM device, etc. The storage device 1030 may be a solid state drive (SSD) device, a hard disk drive (HDD) device, a CD-ROM device, etc. The I/O device 1040 may be an input device, such as a keyboard, a keypad, a mouse device, a touchpad, a touch-screen, etc., and an output device, such as a printer, a speaker, etc. In some exemplary embodiments, the organic light emitting display device 1060 may be included in (or as part of) the I/O device 1040. The power supply 1050 may provide power for operations of the electronic device 1000.

The organic light emitting display device 1060 may be coupled to other components via the buses or other communication links. As described above, the organic light emitting display device 1060 may include a display panel, a display panel driving circuit, and a driving control circuit. The display panel may include a plurality of pixels each having an organic light emitting element. The display panel driving circuit may drive the display panel. The driving control circuit may group m adjacent pixels, which output the same color light, into one pixel-group in the display panel, and may selectively perform a normal driving that operates all of the m adjacent pixels or a combination driving that operates only a portion of the m adjacent pixels based on whether a unit grayscale to be implemented by the pixel-group is greater than or equal to a predetermined reference grayscale. Here, when the combination driving is performed, the driving control circuit may alternately and differently select the portion of the m adjacent pixels for respective frames to alternate a light emitting pattern of the pixel-group for the frames. In some example embodiments, the driving control circuit may be implemented in the display panel driving circuit or may be implemented separately from the display panel driving circuit. In some exemplary embodiments, the driving control circuit may perform the normal driving that implements the unit grayscale by controlling all of the m adjacent pixels to emit light with first luminance corresponding to respective data signals when the unit grayscale to be implemented by the pixel-group is greater than or equal to the reference grayscale. In addition, the driving control circuit may perform the combination driving that implements the unit grayscale by controlling only n adjacent pixels of the m adjacent pixels to emit light with second luminance that is m/n times the first luminance when the unit grayscale to be implemented by the pixel-group is less than the reference grayscale. In some exemplary embodiments, the driving control circuit may perform the normal driving that implements the unit grayscale by controlling all of the m adjacent pixels to emit light with first luminance corresponding to respective data signals when the unit grayscale to be implemented by the pixel-group belongs to a high-grayscale region that is greater than or equal to the reference grayscale. In addition, the driving control circuit may perform the combination driving that implements the unit grayscale by controlling only n adjacent pixels of the m adjacent pixels to emit light with second luminance that is m/n times the first luminance when the unit grayscale to be implemented by the pixel-group belongs to first through (k)-th low-grayscale regions that are less than the reference grayscale, where n and m are differently determined for the first through (k)th low-grayscale regions. Since these features are described above, duplicated description will not be repeated.

The inventive concepts may be applied to an organic light emitting display device and an electronic device including the organic light emitting display device. For example, the inventive concepts may be applied to a cellular phone, a smart phone, a video phone, a smart pad, a smart watch, a tablet PC, a car navigation system, a television, a computer monitor, a laptop, a digital camera, an HMD device, etc.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A method of driving a display panel, the method comprising:
    grouping m adjacent pixels, which output a same color light, into one pixel-group in the display panel, where m is an integer greater than or equal to two;
    determining whether a unit grayscale to be implemented by the pixel-group is greater than or equal to a reference grayscale by analyzing respective data signals applied to the pixel-group;
    performing, in response to the unit grayscale being greater than or equal to the reference grayscale, a normal driving that implements the unit grayscale by controlling all of the m adjacent pixels to emit light with first luminance corresponding to the respective data signals; and
    performing, in response to the unit grayscale being less than the-reference grayscale, a combination driving that implements the unit grayscale by controlling only a portion of the m adjacent pixels to emit light with second luminance that is greater than the first luminance.

2. The method of claim 1, wherein, in response to the combination driving being performed, n adjacent pixels, where n is an integer greater than or equal to 1 and smaller than m, are selected among the m adjacent pixels, and the second luminance is m/n times the first luminance.

3. The method of claim 2, wherein, in response to the combination driving being performed, the n adjacent pixels are differently and alternately selected among the m adjacent pixels for respective frames.

4. The method of claim 3, wherein the combination driving is separately performed on blue color pixels, red color pixels, and green color pixels.

5. The method of claim 3, wherein the combination driving is separately performed on blue color pixels, red color pixels, green color pixels, and white color pixels.

6. The method of claim 1, wherein, in response to a driving frequency of the display panel being less than a determined reference frequency, the normal driving is performed on all pixel-groups of the display panel.

7. The method of claim 1, wherein, in response to a number of low-grayscale pixel-groups of which the unit grayscale is less than the reference grayscale being greater than or equal to a reference number in the display panel, the combination driving is performed on all pixel-groups of the display panel.

8. The method of claim 1, wherein, in response to a number of high-grayscale pixel-groups of which the unit grayscale is greater than or equal to the reference grayscale being greater than or equal to a reference number in the display panel, the normal driving is performed on all pixel-groups of the display panel.

9. A method of driving a display panel, the method comprising:
grouping m adjacent pixels, which output a same color light, into one pixel-group in the display panel, where m is an integer greater than or equal to two;
determining whether a unit grayscale to be implemented by the pixel-group is greater than or equal to a reference grayscale by analyzing respective data signals applied to the pixel-group;
performing, in response to the unit grayscale belonging to a high-grayscale region that is greater than or equal to the reference grayscale, a normal driving that implements the unit grayscale by controlling all of the m adjacent pixels to emit light with first luminance corresponding to the respective data signals; and
performing, in response to the unit grayscale belonging to first through (k)-th low-grayscale regions that are less than the reference grayscale, where k is an integer greater than or equal to two, a combination driving that implements the unit grayscale by controlling n adjacent pixels of the m adjacent pixels, where n is an integer greater than or equal to 1 and less than m, to emit light with second luminance that is m/n times the first luminance,
wherein n and m are differently determined for the first through (k)-th low-grayscale regions.

10. The method of claim 9, wherein, in response to the combination driving being performed, the n adjacent pixels are differently and alternately selected among the m adjacent pixels for respective frames.

11. The method of claim 10, wherein the combination driving is separately performed on blue color pixels, red color pixels, and green color pixels.

12. The method of claim 10, wherein the combination driving is separately performed on blue color pixels, red color pixels, green color pixels, and white color pixels.

13. The method of claim 9, wherein, in response to a driving frequency of the display panel being less than a reference frequency, the normal driving is performed on all pixel-groups of the display panel.

14. The method of claim 9, wherein, in response to a number of low-grayscale pixel-groups of which the unit grayscale is less than the reference grayscale being greater than or equal to a reference number in the display panel, the combination driving is performed on all pixel-groups of the display panel.

15. The method of claim 9, wherein, in response to a number of high-grayscale pixel-groups of which the unit grayscale is greater than or equal to the reference grayscale being greater than or equal to a reference number in the display panel, the normal driving is performed on all pixel-groups of the display panel.

16. An organic light emitting display device, comprising:
a display panel comprising pixels, each pixel comprising an organic light emitting element;
a display panel driving circuit configured to drive the display panel; and
a driving control circuit configured to:
group m adjacent pixels, which output a same color light, into one pixel-group in the display panel, where m is an integer greater than or equal to two;
determine whether a unit grayscale to be implemented by the pixel group is greater than or equal to a reference grayscale based on analyzation of respective data signals applied to the pixel-group;
selectively perform, based on whether the unit grayscale to be implemented by the pixel-group is greater than or equal to the reference grayscale, a normal driving configured to operate all of the m adjacent pixels to emit light with a first luminance corresponding to the respective data signals or a combination driving configured to operate only a portion of the m adjacent pixels to emit light with a second luminance that is greater than the first luminance.

17. The organic light emitting display device of claim 16, wherein the driving control circuit is part of the display panel driving circuit.

18. The organic light emitting display device of claim 16, wherein, in response to the combination driving being performed, the driving control circuit is configured to differently and alternately select the portion of the m adjacent pixels for respective frames to alternate a light emitting pattern of the pixel-group for the frames.

19. The organic light emitting display device of claim 18, wherein:
the driving control circuit is configured to:
perform, in response to the unit grayscale belonging to a high-grayscale region that is greater than or equal to the reference grayscale, the normal driving that implements the unit grayscale by controlling all of the m adjacent pixels to emit light with the first luminance corresponding to respective data signals; and
perform, in response to the unit grayscale belonging to first through (k)-th low-grayscale regions that are less than the reference grayscale, where k is an integer greater than or equal to two, the combination driving that implements the unit grayscale by controlling n adjacent pixels of the m adjacent pixels, where n is an integer greater than or equal to one and less than m, to emit light with the second luminance that is m/n times the first luminance; and
n and m are differently determined for the first through (k)-th low-grayscale regions.

* * * * *